(12) United States Patent
Ohta et al.

(10) Patent No.: US 6,374,384 B1
(45) Date of Patent: Apr. 16, 2002

(54) REED SOLOMON ERROR CORRECTING CIRCUIT AND METHOD AND DEVICE FOR EUCLIDEAN MUTUAL DIVISION

(75) Inventors: Kazuhiro Ohta, Nishinomiya; Toshihiko Fukuoka, Shijonawate; Yoshihiko Fukumoto, Mukou, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/202,998

(22) PCT Filed: Jun. 25, 1997

(86) PCT No.: PCT/JP97/02198

§ 371 Date: Mar. 10, 1999

§ 102(e) Date: Mar. 10, 1999

(87) PCT Pub. No.: WO97/50184

PCT Pub. Date: Dec. 31, 1997

(30) Foreign Application Priority Data

Jun. 27, 1996 (JP) .............................. 8-167009
Jul. 11, 1996 (JP) .............................. 8-181914

(51) Int. Cl.[7] .......................................... H03M 13/15
(52) U.S. Cl. ..................................................... 714/784
(58) Field of Search ........................................ 714/784

(56) References Cited

U.S. PATENT DOCUMENTS

| | | | | |
|---|---|---|---|---|
| 4,747,103 A | * | 5/1988 | Iwamura et al. | 371/37 |
| 5,107,503 A | * | 4/1992 | Riggle et al. | 371/37.1 |
| 5,341,385 A | * | 8/1994 | Shirota | 371/37.1 |
| 5,805,616 A | * | 9/1998 | Oh | 371/37.11 |

OTHER PUBLICATIONS

M.A. Hasan et al.: "Algorithms and Architectures for the design of a VLSI Reed–Solomon Codec" Reed–Solomon Codes and Their Applications, S. Wicker Ed., 1994, pp. 60–107, XP002055402.

* cited by examiner

Primary Examiner—Stephen M. Baker
(74) Attorney, Agent, or Firm—Wenderoth, Lind & Ponack, L.L.P.

(57) ABSTRACT

The Reed-Solomon error-correcting circuit in accordance with a first invention is constructed so as to perform parallel operation by two-step pipelined processing in a syndrome generating circuit and an error-correcting circuit. The error-correcting circuit operates in synchronization with a clock with a period of 1/N the period of the received symbol clock, where N≧1, and N is an integer. Further, an error-locator-polynomial/error-evaluator-polynomial calculating circuit in the error-correcting circuit has a memory in which the syndrome is input and a Galois-field operations circuit that is connected to the memory. By these means, the Reed-Solomon error-correcting circuit in the present invention performs high-speed processing with small-scale hardware. Further, in an Euclid's algorithm that obtains an error-locator-polynomial, by performing Galois-field operations, from the syndrome equation $$S(z) = s_{k-1}z^{k-1} + s_{k-2}z^{k-2} + \ldots + s_0,$$

a second invention performs initial setting as $$M(z) = 1,$$

$$B(z) = s_{k-1}z^{k-1} + s_{k-2}z^{k-2} + \ldots + s_0,$$

and, depending on the coefficients of the syndrome equation S(z), as $$A(z) = s_{k-2}z^{k-1} + s_{k-3}z^{k-2} + \ldots + s_0 z,$$

$$L(z) = z,$$

to reduce the number of Galois-field operations.

11 Claims, 18 Drawing Sheets

Fig.8

| 101 | 102 | 103 | 104 | 105 | 106 | 107 | 108 | 109 | 110 | 111 | 112 | 113 | 114 | 115 | 116 |
|---|---|---|---|---|---|---|---|---|---|---|---|---|---|---|---|
| 0 | FF | 5F | 51 | 91 | 58 | A0 | 72 | A7 | 14 | CA | AE | EB | A9 | E9 | EB |
| $z^0$ | $z^1$ | $z^2$ | $z^3$ | $z^4$ | $z^5$ | $z^6$ | $z^7$ | $z^8$ | $z^9$ | $z^{10}$ | $z^{11}$ | $z^{12}$ | $z^{13}$ | $z^{14}$ | $z^{15}$ |

100

| 121 | 122 | 123 | 124 | 125 | 126 | 127 | 128 | 129 | 130 | 131 | 132 | 133 | 134 | 135 | 136 |
|---|---|---|---|---|---|---|---|---|---|---|---|---|---|---|---|
| FF | 5F | 51 | 91 | 58 | A0 | 72 | A7 | 14 | CA | AE | EB | A9 | E9 | EB | 85 |
| $z^0$ | $z^1$ | $z^2$ | $z^3$ | $z^4$ | $z^5$ | $z^6$ | $z^7$ | $z^8$ | $z^9$ | $z^{10}$ | $z^{11}$ | $z^{12}$ | $z^{13}$ | $z^{14}$ | $z^{15}$ |

120

| 141 | 142 | 143 | 144 | 145 | 146 | 147 | 148 | 149 |
|---|---|---|---|---|---|---|---|---|
| 0 | 1 | 0 | 0 | 0 | 0 | 0 | 0 | 0 |
| $z^0$ | $z^1$ | $z^2$ | $z^3$ | $z^4$ | $z^5$ | $z^6$ | $z^7$ | $z^8$ |

140

| 161 | 162 | 163 | 164 | 165 | 166 | 167 | 168 | 169 |
|---|---|---|---|---|---|---|---|---|
| 0 | 0 | 0 | 0 | 0 | 0 | 0 | 0 | 0 |
| $z^0$ | $z^1$ | $z^2$ | $z^3$ | $z^4$ | $z^5$ | $z^6$ | $z^7$ | $z^8$ |

Row 110:
- 101: 0 ($z^0$)
- 102: 46 $z^1$
- 103: 7F $z^2$
- 104: BF $z^3$
- 105: A0 $z^4$
- 106: 21 $z^5$
- 107: 96 $z^6$
- 108: 5C $z^7$
- 109: 27 $z^8$
- 110: 5F $z^9$
- 111: 6D $z^{10}$
- 112: EC $z^{11}$
- 113: F4 $z^{12}$
- 114: 94 $z^{13}$
- 115: 0 $z^{14}$
- 116: 0 $z^{15}$

Row 120:
- 121: 46 ($z^0$)
- 122: 7F $z^1$
- 123: BF $z^2$
- 124: A0 $z^3$
- 125: 21 $z^4$
- 126: 96 $z^5$
- 127: 5C $z^6$
- 128: 27 $z^7$
- 129: 5F $z^8$
- 130: 6D $z^9$
- 131: EC $z^{10}$
- 132: F4 $z^{11}$
- 133: 94 $z^{12}$
- 134: 0 $z^{13}$
- 135: 0 $z^{14}$
- 136: 9F $z^{15}$

Row 140:
- 141: 0 ($z^0$)
- 142: 1 $z^1$
- 143: 0 $z^2$
- 144: 0 $z^3$
- 145: 0 $z^4$
- 146: 0 $z^5$
- 147: 0 $z^6$
- 148: 0 $z^7$
- 149: 0 ($z^8$)

Row 160:
- 161: 1 ($z^0$)
- 162: 0 $z^1$
- 163: 0 $z^2$
- 164: 0 $z^3$
- 165: 0 $z^4$
- 166: 0 $z^5$
- 167: 0 $z^6$
- 168: 0 $z^7$
- 169: 0 ($z^8$)

300:
- 301: 0 ($z^0$)
- 302: 0 $z^1$
- 303: 0 $z^2$
- 304: 0 $z^3$
- 305: 0 $z^4$
- 306: 0 $z^5$
- 307: 0 $z^6$
- 308: 0 $z^7$
- 309: 0 $z^8$
- 310: 0 $z^9$
- 311: 0 $z^{10}$
- 312: 0 $z^{11}$
- 313: 0 $z^{12}$
- 314: 0 $z^{13}$
- 315: 0 $z^{14}$
- 316: 0 $z^{15}$
- 317: 1 $z^{16}$
- 339: 16(octal)

320:
- 321: 90 ($z^0$)
- 322: FD $z^1$
- 323: 79 $z^2$
- 324: 6B $z^3$
- 325: 0B $z^4$
- 326: 91 $z^5$
- 327: B7 $z^6$
- 328: E7 $z^7$
- 329: 9D $z^8$
- 330: 09 $z^9$
- 331: D8 $z^{10}$
- 332: 9F $z^{11}$
- 333: D8 $z^{12}$
- 334: FE $z^{13}$
- 335: 0 $z^{14}$
- 336: 0 $z^{15}$

340:
- 341: 0 ($z^0$)
- 342: 0 $z^1$
- 343: 0 $z^2$
- 344: 0 $z^3$
- 345: 0 $z^4$
- 346: 0 $z^5$
- 347: 0 $z^6$
- 348: 0 $z^7$
- 349: 0 $z^8$

360:
- 361: 1 ($z^0$)
- 362: 0 $z^1$
- 363: 0 $z^2$
- 364: 0 $z^3$
- 365: 0 $z^4$
- 366: 0 $z^5$
- 367: 0 $z^6$
- 368: 0 $z^7$
- 369: 0 $z^8$

REED SOLOMON ERROR CORRECTING CIRCUIT AND METHOD AND DEVICE FOR EUCLIDEAN MUTUAL DIVISION

BACKGROUND OF THE INVENTION

1. Field of the Invention

The present invention relates to a Reed-Solomon error-correcting circuit that is used as a system of error correction, and also to the Euclidian algorithm and apparatus that are used in systems of error correction such as BHC error-correcting systems and Reed-Solomon error correcting systems.

2. Description of the Related Art

Error correcting systems such as BHC error-correcting systems and Reed-Solomon error-correcting systems are used as error correcting systems in various fields such as recording media like optical fibers and digital transmission systems like digital satellite broadcasting systems. Of recent years, as the scale of recording and transmission has become greater, error-correcting circuits that accommodate high-speed processing have been developed.

So far, as a Reed-Solomon error-correcting circuit that accommodates high-speed processing, there has been known the one disclosed in Japanese Patent Laid-Open Publication No. 3-195216.

This Reed-Solomon error-correcting circuit comprises, as shown in FIG. 18, a syndrome generating circuit 1 (equivalent to the syndrome generating circuit in the Reed-Solomon error-correction circuit of the present invention), an error-locator-polynomial deriving circuit 2 (equivalent to the error-locator-polynomial/error-evaluator-polynomial calculating circuit within the error correcting circuit in the Reed-Solomon error-correcting circuit of the present invention), an error-location detecting circuit 3 and an error-pattern detecting circuit 4 and an AND gate 5 and an EXOR gate 6 (equivalent to the correcting circuit within the error correcting circuit in the Reed-Solomon error-correcting circuit of the present invention), and a delay circuit 7 (equivalent to the memory in the Reed-Solomon error-correcting circuit of the present invention).

The error-locator-polynomial deriving circuit in this Reed-Solomon error-correcting circuit requires, as described in the embodiment of the patent disclosure, a great number of Galois-field calculating circuits installed between the registers of the shift registers, in order to accommodate high-speed processing. Therefore, there is a problem that the scale of hardware is large.

Also, in order to limit internal delays and increases in power consumption due to large-scale hardware, a high-speed clock is not used, and a received symbol clock is used for operation. Therefore, one packet of time is taken for processing in the error-locator-polynomial deriving circuit.

Therefore, there is required, at least, parallel operation with three-step pipelined processing by the syndrome generating circuit, the error-locator-polynomial deriving circuit, and the error-location detecting circuit, error-pattern detecting circuit, AND gate, and EXOR gate. Therefore, the delay circuit must hold three packets of data, so that the scale of hardware becomes still larger.

Next, the operation of the above circuit is described. In error correcting systems such as BHC error-correcting systems and Reed-Solomon error-correcting systems, first a syndrome equation $S(z)=s_{k-1}z^{k-1}+s_{k-2}z^{k-2}+\ldots+s_0$ based on the received signal is obtained on the receiver side. In the Reed-Solomon error-correcting circuit described above, the syndrome generating circuit performs this operation.

If there exists no error in the signal, then the coefficients $S_{k-1}$ to $s_0$ of the syndrome equation $S(z)$ become $s_{k-1}=s_{k-2}=\ldots=s_0=0$, that is, the syndrome equation becomes $S(z)=0$. If there exist some errors in the signal, the syndrome equation becomes $S(z)\neq 0$.

If there exist some errors in the received signal, so that the syndrome signal becomes $S(z)\neq 0$, then, the error-locator-polynomial $\sigma(z)$ is obtained from the syndrome equation $S(z)$. In the Reed-Solomon error-correcting circuit described above, the error-locator-polynomial deriving circuit performs this operation.

Finally, errors are corrected by using the error-locator-polynomial $\sigma(z)$.

Generally, in order to obtain the error-locator-polynomial $\sigma(z)$ from the syndrome equation $S(z)$, an Euclid's algorithm is used. In the past, as the Euclid's algorithm, the one described in "Development of Error correcting methods and LSI for optical disk drives," *Computer Architecture*, 67–3 (Sep. 16, 1987) is known.

A description is given in the following with the Reed-Solomon error-correcting method based on a report of the Committee on Digital Broadcasting Systems in the Council of Electronic Communication.

Code generating polynomial:

$$g(z)=(z+\alpha 0)(z+\alpha 1)(z+\alpha 2)\ldots(z+\alpha 15),\ (\alpha=02h).$$

Field generating polynomial: x8+x4+x3+x2+1.

Packet length: 204 bytes.

Information bytes therein: 188 bytes.

Error correcting number: 8 bytes.

In the Euclid's algorithm of the Reed-Solomon error-correcting system described above, initial setting for the polynomials A(z), B(z), L(z), and M(z) is made from the syndrome equation $$S(z)=s_{15}z^{15}+s_{14}Z^{14}+\ldots+s_0$$

based on the signal decoded with the Reed-Solomon code, where $s_{15},\ldots,s_0$ are elements of the Galois field GF(28). Then the error-locator-polynomial $\sigma(z)$ is obtained through Galdis-field operations. Operations on Galois fields are described in Hideki Imai, *Coding Theory*, Chapter 3, Institute of Electronics and Communication Engineers of Japan.

In the following is described the Euclid's algorithm in a prior example in conjunction with figures.

FIG. 19 is a flowchart illustrating the method of initial setting in a prior exemplary Euclid's algorithm. FIG. 20 is a flowchart illustrating a general Euclid's algorithm after initial setting.

In the Euclid's algorithm in the prior example, according to the method of initial setting illustrated in FIG. 19, initial setting for the polynomials A(z), B(z), L(z), and M(z) is performed from the syndrome equation $$S(z)=s_{15}z^{15}+s_{14}Z^{14}+\ldots+s_0$$

based on a signal decoded with the Reed-Solomon error correcting code, where $s_{15},\ldots,s_0$ are elements of the Galois field GF(28). Then, according to the general Euclid algorithm after the initial setting illustrated in FIG. 20, Galois-field operations are performed to obtain the error-locator-polynomial $\sigma(z)$. In the Galois-field operations, processing for reducing the degrees of the polynomials A(z) and B(z) is performed. When at least one of the degrees of the polynomials A(z) and B(z) becomes equal to or less than 7, the processing is terminated.

In the following is described an example of the Euclid's algorithm in the prior example illustrated in FIGS. 19, 20.

In the following, a first example of operations in the Euclid's algorithm in the prior example is described. This example of operations is in the case where $s_{15}, \ldots, s_8 \neq 0$ for the coefficients of the syndrome equation $S(z)$. In this example of operations, after sixth operations on the Galois field, the error-locator-polynomial $\sigma(z)$ is obtained.

First example of operations in prior Euclidean algorithm. Syndrome.

$$S(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$$

After initial setting.

$$A(z) = z^{16}$$

$$B(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$$

$$L(Z) = \qquad 0$$

$$M(Z) = \qquad 1$$

After first Galois-field operations.

$$A(z) = EBz^{15} + E9z^{14} + A9z^{13} + F8z^{12} + AEz^{11} + C4z^{10} + 14z^9 + A7z^8 + 72z^7 + A0z^6 + 58z^5 + 91z^4 + 51z^3 + 5Fz^2 + FFz$$

$$B(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$$

$$L(Z) = \qquad z$$

$$M(Z) = \qquad 1$$

After second Galois-field operations.

$$A(z) = \qquad 96z^{14} + 6z^{13} + 48z^{12} + A7z^{11} + 71z^{10} + 88z^9 + D4z^8 + C8z^7 + 20z^6 + E7z^5 + 27z^4 + C9z^3 + E6z^2 + 4Cz + C$$

$$B(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$$

$$L(Z) = \qquad z + 68$$

$$M(Z) = \qquad 1$$

After third Galois-field operations.

$$A(z) = 96z^{14} + 06z^{13} + 48z^{12} + A7z^{11} + 71z^{10} + 88z^9 + D4z^8 + C8z^7 + 20z^6 + E7z^5 + 27z^4 + C9z^3 + E6z^2 + 4Cz + 0C$$

$$B(z) = 91z^{14} + 18z^{13} + 3Bz^{12} + 4Dz^{11} + A4z^{10} + 3Ez^9 + BCz^8 + F6z^7 + 42z^6 + 6Bz^5 + 10z^4 + 41z^3 + 7z^2 + ABz + FF$$

$$L(Z) = \qquad z + 68$$

$$M(Z) = E0z^2 + A0z + 1$$

After fourth Galois-field operations.

$$A(z) = \qquad 71z^{13} + E1z^{12} + 41z^{11} + B7z^{10} + 9Fz^9 + 65z^8 + 6Dz^7 + 19z^6 + 61z^5 + 7Dz^4 + 9Az^3 + 14z^2 + 55z + A2$$

$$B(z) = 91z^{14} + 18z^{13} + 3Bz^{12} + 4Dz^{11} + A4z^{10} + 3Ez^9 + BCz^8 + F6z^7 + 42z^6 + 6Bz^5 + 10z^4 + 41z^3 + 7z^2 + ABz + FF$$

$$L(Z) = 2Bz^2 + 5Fz + 4E$$

$$M(Z) = E0z^2 + A0z + 1$$

After fifth Galois-field operations.

$$A(z) = 71z^{13} + E1z^{12} + 41z^{11} + B7z^{10} + 9Fz^9 + 65z^8 + 6Dz^7 + 19z^6 + 61z^5 + 7Dz^4 + 9Az^3 + 14z^2 + 55z + A2$$

$$B(z) = FEz^{13} + EBz^{12} + 37z^{11} + 49z^{10} + 6Az^9 + 61z^8 + CCz^7 + DCz^6 + B9z^5 + 8Bz^4 + 84z^3 + 42z^2 + A8z + FF$$

$$L(Z) = 2Bz^2 + 5Fz + 4E$$

$$M(Z) = 4Ez^3 + 49z^2 + BAz + 1$$

After sixth Galois-field operations.

$$A(z) = 59z^2 + 93$$

$$B(z) = FEz^{13} + EBz^{12} + 37z^{11} + 49z^{10} + 6Az^9 + 61z^8 + CCz^7 + DCz^6 + B9z^5 + 8Bz^4 + 84z^3 + 42z^2 + A8z + FF$$

$$L(Z) = 6Az^3 + 9Cz^2 + FEz + E$$

$$M(Z) = 4Ez^3 + 49z^2 + BAz + 1$$

Result.

$$\sigma(z) = L(Z) = 6Az^3 + 9Cz^2 FEz + E$$

In the following, a second example of operations in the Euclid's algorithm in the prior example is described. This example of operations is in the case where $s_{15} \neq 0$ and at least one of $s_{14}, \ldots, s_8$ is 0 for the coefficients of the syndrome equation $S(z)$. In this example of operations, after fourth operations on the Galois field, the error-locator-polynomial $\sigma(z)$ is obtained.

Second example of operations in prior Euclidean algorithm. Syndrome.

$$S(z) = 9Fz^{15} + 94z^{12} + F4z^{11} + ECz^{10} + 6Dz^9 + 5Fz^8 + 27z^7 + 5Cz^6 + 96z^5 + 21z^4 + A0z^3 + BFz^2 + 7Fz + 46$$

After initial setting $$A(z) = z^{16}$$

$$B(z) = 9Fz^{15} + 94z^{12} + F4z^{11} + ECz^{10} + 6Dz^9 + 5Fz^8 + 27z^7 + 5Cz^6 + 96z^5 + 21z^4 + A0z^3 + BFz^2 + 7Fz + 46$$

$$L(Z) = 0$$

$$M(Z) = 1$$

After first Galois-field operations $$A(z) = +94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$$

$$B(z) = 9Fz^{15} + 94z^{12} + F4z^{11} + ECz^{10} + 6Dz^9 + 5Fz^8 + 27z^7 + 5Cz^6 + 96z^5 + 21z^4 + A0z^3 + BFz^2 + 7Fz + 46$$

$$L(Z) = z$$

$$M(Z) = 1$$

After second Galois-field operations $A(z) = 94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$ $B(z) = Bz^{14} + 2Ez^{13} + 81z^{12} + 91z^{11} + 38z^{10} + 2Fz^9 + FAz^8 + BDz^7 + FDz^6 + 41z^5 + C3z^4 + FDz^3 + BFz^2 + 7Fz + 46$ $L(Z) = z$ $M(Z) = 1Dz^3 + 1$ After third Galois-field operations $A(z) = 94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$ $B(z) = D1z^{13} + 43z^{12} + E9z^{11} + 2z^{10} + DCz^9 + E4z^8 + 8Ez^7 + 46z^6 + 40z^5 + ABz^4 + 60z^3 + A4z^2 + 7Fz + 46$ $L(Z) = z$ $M(Z) = 1Dz^3 + 1Cz^2 + 1$ After fourth Galois-field operations $A(z) = 79z^2 + 10z + 96$ $B(z) = D1z^{13} + 43z^{12} + E9z^{11} + 2z^{10} + DCz^9 + E4z^8 + 8Ez^7 + 46z^6 + 40z^5 + ABz^4 + 60z^3 + A4z^2 + 7Fz + 46$ $L(Z) = 84z^3 + 3Cz^2 + z + B8$ $M(Z) = 1Dz^3 + 1Cz^2 + 1$ Result $\sigma(z) = L(Z) = 84z^3 + 3Cz^2 + z + B8$ A third example of operations in the Euclid's algorithm in the prior example is described in the following. This example of operations is in the case where $S_{15} = \ldots = s_n = 0$ and $s_{n-1} \neq 0$, where $n \leq 15$, and n is an integer, for the coefficients of the syndrome equation S(z). In this example of operations, after fourth operations on the Galois field, the error-locator-polynomial $\sigma(z)$ is obtained.

Third example of operations in prior Euclidean algorithm.
Syndrome.

$S(z) = FEz^{13} + D8z^{12} + 9Fz^{11} + D8z^{10} + 09z^9 + 9Dz^8 + E\ 7z^7 + B7z^6 + 91z^5 + 0Bz^4 + 6Bz^3 + 79z^2 + FDz + 90$

After initial setting

After first Galois-field operations $A(z) = D8z^{15} + 9Fz^{14} + D8z^{13} + 09z^{12} + 9Dz^{11} + E7z^{10} + B7z^9 + 91z^8 + 0Bz^7 + 6Bz^6 + 79z^5 + FDz^4 + 90z^3$ $B(z) = FEz^{13} + D8z^{12} + 9Fz^{11} + D8z^{10} + 09z^9 + 9Dz^8 + E7z^7 + B7z^6 + 91z^5 + 0Bz^4 + 6Bz^3 + 79z^2 + FDz + 90$ $A(Z) = z^{16} \cdot z^3$ $M(Z) =$
$B(z) = FEz^{13} + D8z^{12} + 9Fz^{11} + D8z^{10} + 09z^9 + 9Dz^8 + E7z^7 + B7z^6 + 91z^5 + 0Bz^4 + 6Bz^3 + 79z^2 + FDz + 90$ $L(Z) = 0$ $M(Z) = 1$ After second Galois-field operations $A(z) = ECz^{14} + 7Az^{13} + 7Az^{12} + C1z^{11} + 83z^{10} + 4Dz^9 + F0z^8 + C1z^7 + F1z^6 + FAz^5 + C6z^4 + EDz^3 + A9z^2$ $B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$ $L(Z) = z^3 + 63z^2$ $M(Z) = 1$ After third Galois-field operations $A(z) = 1Az^{13} + 87z^{12} + A1z^{11} + 87z^{10} + 2Cz^9 + 8Cz^8 + 43z^7 + FFz^6 + 62z^5 + z^4 + 22z^3 + 97z^2 + 40z$ $B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$ $L(Z) = z^3 + 63z^2 + 4Ez$ $M(Z) = 1$ After fourth Galois-field operations $A(z) = EDz^2 + EFz + FA$ $B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$ $L(Z) = z^3 + 63z^2 + 4Ez + 98$ $M(Z) = 1$ Result $\sigma(z) = L(Z) = z^3 + 63z^2 + 4Ez + 98$ As described above, in the prior Euclid's algorithm, a great number of Galois-field operations are required, and this fact has been an obstacle to increase the speed of processing.

As described above, there has been a problem that the scale of hardware becomes large in order to accommodate high-speed processing in the prior Reed-Solomon error-correcting circuit. Also, a great number of Galois-field operations are required and become an obstacle to increase the speed of processing.

SUMMARY OF THE INVENTION

BRIEF DESCRIPTION OF THE DRAWINGS

FIG. 3 is a state diagram of the polynomial storage devices in a first operation example of the same Euclid's algorithm apparatus.

FIG. 9 is a state diagram of the polynomial storage devices in a second operation example of the same Euclid's algorithm apparatus.

FIG. 15 is a state diagram of the polynomial storage devices in a first operation example of the same Euclid's algorithm apparatus.

FIG. 16 is a state diagram of the polynomial storage devices in a second operation example of the same Euclid's algorithm apparatus.

FIG. 17 is a state diagram of the polynomial storage devices in a third operation example of the same Euclid's algorithm apparatus.

DETAILED DESCRIPTION OF THE PREFERRED EMBODIMENTS

First Embodiment

Figure 1:
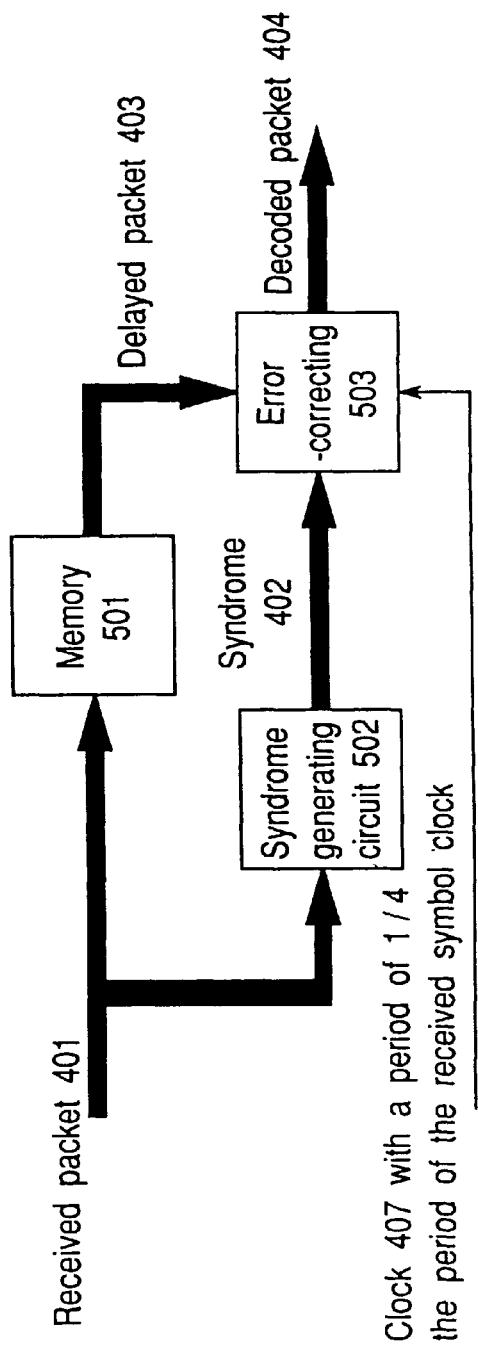
FIG. 1 is a block diagram illustrating the Reed-Solomon error-correcting circuit in a first embodiment of the present invention.

FIG. 1 is a block diagram illustrating the Reed-Solomon error-correcting circuit in a first embodiment of the present invention.

In FIG. 1, 401 is a received packet, 402 is a syndrome, 403 is a delayed packet, 404 is a decoded packet, 407 is a clock with a period of ¼ the period of the received symbol clock, 501 is a memory that inputs the received packet 401 and delays it by an amount for 2 packets to output as the delayed packet 403, 502 is a syndrome generating circuit that inputs the received packet 401 to output the syndrome 402, and 503 is an error-correcting circuit that inputs the delayed packet 403 and the syndrome 402 to output the decoded packet 404.

The syndrome generating circuit 502 and the error-correcting circuit 503 have a pipelined structure for each packet. The clock 407 with a period of ¼ the period of the received symbol clock is supplied to the error-correcting circuit 503.

Figure 2:
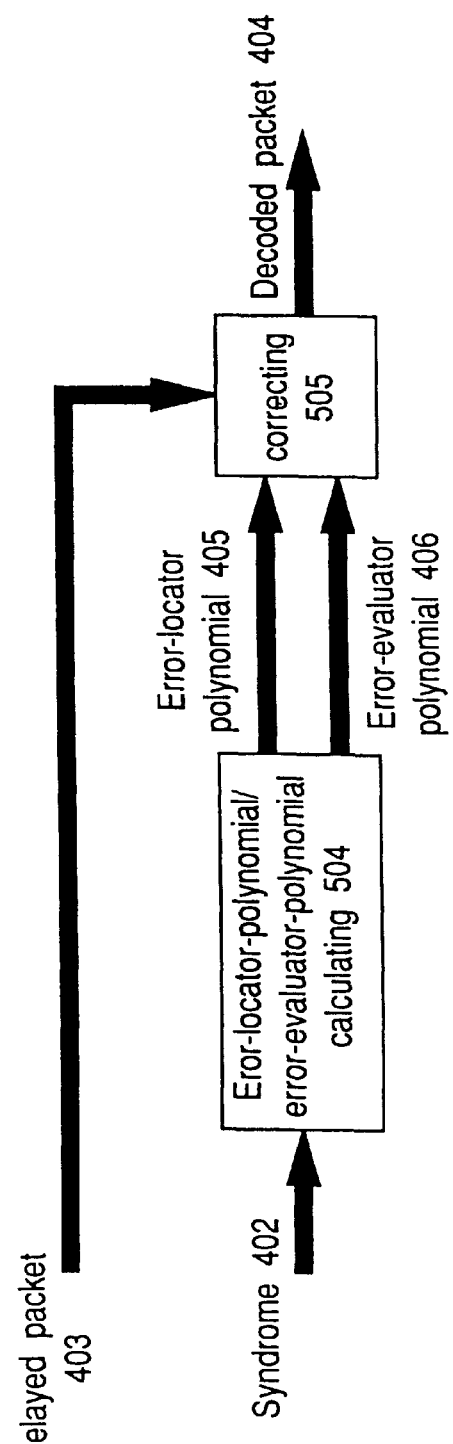
FIG. 2 is a block diagram illustrating the internal construction of the error-correcting circuit 503.

FIG. 2 is a block diagram illustrating the internal construction of the error-correcting circuit 503. In FIG. 2, 504 is an error-locator-polynomial/error-evaluator-polynomial calculating circuit that inputs the syndrome 402 to output the error-locator-polynomial 405 and the error-evaluator-polynomial 406. 505 is a correcting circuit that inputs the delayed packet 403, the error-locator-polynomial 405, and the error-evaluator-polynomial 406, obtains errors contained in the delayed packet 403 from the error-locator-polynomial 405 and the error-evaluator-polynomial 406, removes the errors from the delayed packet 403, and outputs the decoded packet 404.

Figure 3:
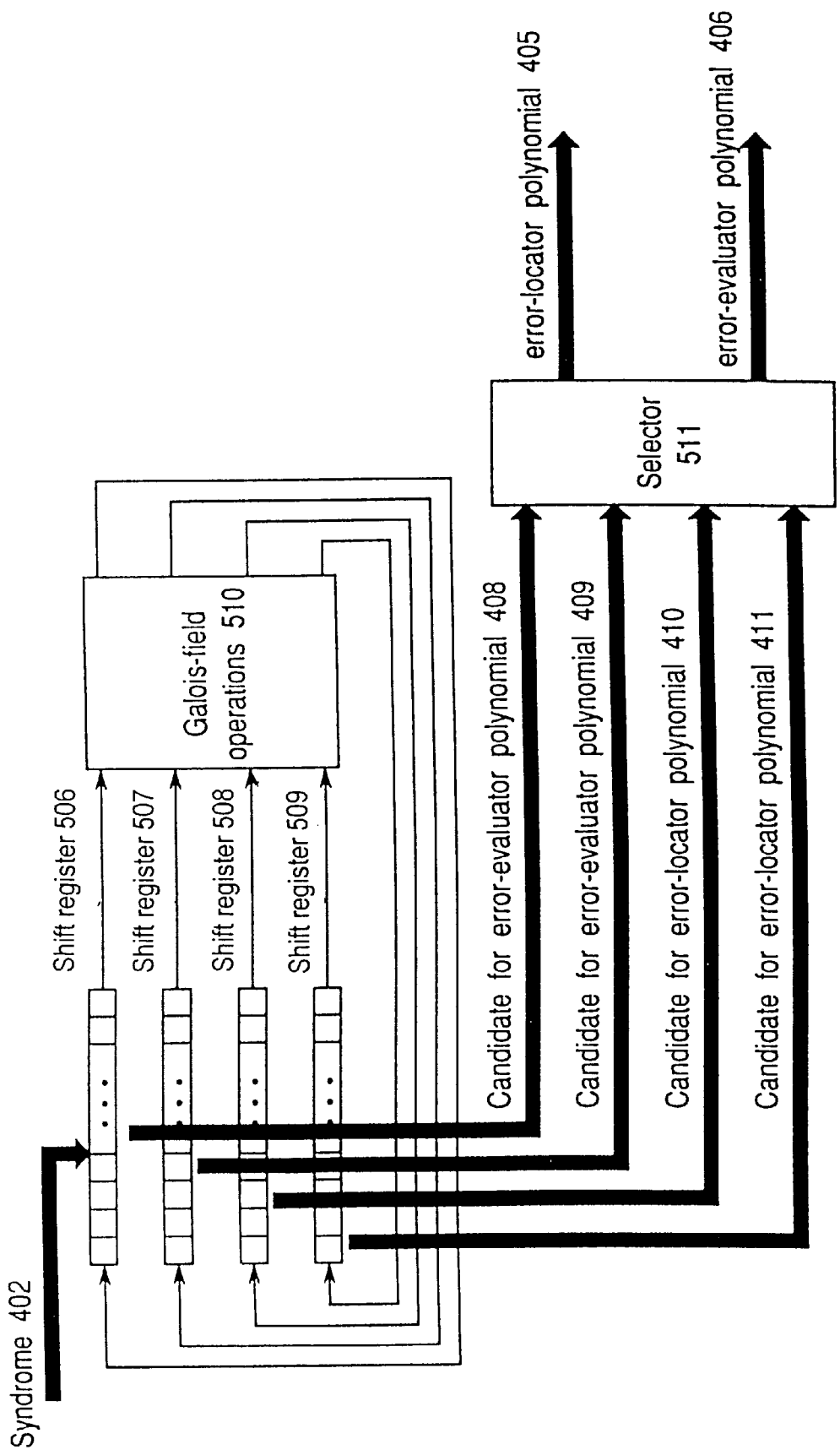
FIG. 3 is a block diagram illustrating the internal construction of the error-locator-polynomial/error-evaluator-polynomial calculating circuit 504.

FIG. 3 is a block diagram illustrating the internal construction of the error-locator-polynomial/error-evaluator-polynomial calculating circuit 504. In FIG. 3, 408 and 409 are candidates for the error-evaluator-polynomial. 410 and 411 are candidates for the error-locator-polynomial. 506 is a shift register that inputs the syndrome 402 as its initial value, successively inputs, in its first step after that, the output of a Galois-field operations circuit, performs shift operations, outputs the data in the last step, and outputs, after the operations, the data stored therein as the candidate 408 for the error-evaluator-polynomial. 507 is a shift register that inputs a constant as its initial value, successively inputs, in its first step after that, the output of a Galois-field operations circuit, performs shift operations, outputs the data in the last step, and outputs, after the operations, the data stored therein as the candidate 409 for the error-evaluator-nolynomial. 508 is a shift register that inputs a constant as its initial value, successively inputs, in its first step after that, the output of a Galois-field operations circuit, performs shift operations, outputs the data in the last step, and outputs, after the operations, the data stored therein as the candidate 410 for the error-locator-polynomial. 508 is a shift register that inputs a constant as its initial value, successively inputs, in its first step after that, the output of a Galois-field operations circuit, performs shift operations, outputs the data in the last step, and outputs, after the operations, the data stored therein as the candidate 411 for the error-locator-polynomial.

510 is a Galois-field operations circuit that inputs the data in the last step of the shift registers 506 to 509 and performs Galois-field operations to output the results. 511 is a selector that inputs the candidates 408, 409 for the error-evaluator-polynomial and the candidates 410, 411 for the error-locator-polynomial, to output the error-locator-polynomial 405 and the error-evaluator-polynomial 406.

The operation of the Reed-Solomon error-correcting circuit constructed in this way in the first embodiment of present invention is described in the following.

The memory 501 inputs the received packet 401 to output the delayed packet 403 by delaying by an amount for 2 packets. This corresponds to the fact that the syndrome generating circuit 502 and the error-correcting circuit 503 have a two-step pipelined structure for each packet.

The syndrome generating circuit 502 inputs the received packet 401 to output the syndrome 402.

The error-correcting circuit 503S inputs the syndrome 402 and the delayed packet 403, obtains, in the error-locator-polynomial/error-evaluator-polynomial calculating circuit 504, the error-locator-polynomial 405 and the error-evaluator-polynomial 406 from the syndrome 402, obtains errors contained in the delayed packet 403, removes the errors from the delayed packet 403, and outputs the decoded packet 404.

The syndrome generating circuit 502 and the error-correcting circuit 503 perform parallel operation by pipelined processing for each packet.

The error-correcting circuit 503 operates in synchronization with a clock 7 with a period of ¼ the period of the received symbol clock.

The operation of the error-locator-polynomial/error-evaluator-polynomial calculating circuit 504 within the error-correcting circuit 503 is described in the following.

The shift register 506 inputs the syndrome 402 as its initial value. The shift registers 507 to 509 input constants as their initial values.

After that, the shift register 506 to 509 successively input, in their first steps, the output of a Galois-field operations circuit 510, perform shift operations, and output the data in their last steps.

The Galois-field operations circuit 510 inputs the data in the last steps of the shift registers 506 to 509 and performs Galois-field operations, and outputs the results.

After the operations are finished, the shift registers 506 to 509 respectively output the data stored therein as the candidates 408, 409 for the error-evaluator-polynomial and the candidates 410, 411 for the error-locator-polynomial.

The selector 511 inputs the Candidates 408, 409 for the error-evaluator-polynomial and the candidates 410, 411 for the error-locator-polynomial and outputs the error-locator-polynomial 405 and the error-evaluator-polynomial 406.

The Reed-Solomon error-correcting circuit in the first embodiment of the present invention performs error correction by performing the operation described above.

In this way, the Reed-Solomon error-correcting circuit in the first embodiment of the present invention performs a similar operation as the Reed-Solomon error-correcting circuit in the prior example described above. However, the error-locator-polynomial deriving Circuit (equivalent to the error-locator-polynomial/error-evaluator-polynomial calculating circuit of the Reed-Solomon error-correcting circuit in the present invention) of the Reed-Solomon error correcting circuit in the prior example had a large number of Galois-field operations circuits between the shift registers. On the other hand, the error-locator-polynomial/error-evaluator-polynomial calculating circuit 504 of the Reed-Solomon error-correcting circuit in the first embodiment of the present invention does not have any Galois-field operations circuit between the shift registers and has only a Galois-field operations circuit that inputs the outputs in the last steps of the shift registers, so that the scale of hardware is small.

Therefore, the internal delay and power consumption are small, so that a high-speed clock can be used. Therefore, as described above, the operation can be synchronized with the clock 7 that has a period of ¼ the period of the received symbol clock. Therefore, as the Reed-Solomon error-correcting circuit in the first embodiment of the present invention, the construction of the error-locator-polynomial/ error-evaluator-polynomial calculating circuit 504 that has no Galois-field operations circuits between the shift registers can sufficiently accommodate high-speed processing, and also, parallel operation by two-step pipelined processing can accommodate high-speed processing. As a result, it is sufficient for the memory 501 to hold two packets of data, so that the scale of hardware becomes still smaller.

In the above description, the error-correcting circuit 503 has been constructed so as to operate with a clock with a period of ¼ the period of the received symbol clock. However, the implementation can be made with another period such as ½ or ⅛.

Also, in the above description, the error-locator-polynomial/error-evaluator-polynomial calculating circuit 504 has been equipped with four shift registers, but can be equipped with a different number of registers. For example, two shift registers arranged in serial or eight registers divided from the above and others can be implemented in various embodiments. Also, one memory can be used to substitute the shift registers.

Further, in the error-locator-polynomial/error-evaluator-polynomial evaluator-polynomial calculating circuit 504, the outputs of the shift registers in their last steps are input again to the shift registers through the Galois-field operations circuit, the circuit 504 can be operated in the same way as in a construction that has Galois-field operations circuits between the registers.

The present invention is independent of any of these minor differences in embodiments. In a Reed-Solomon error-correcting circuit that receives a transmitted packet encoded with a Reed-Solomon code, decodes the received packet with a Reed-Solomon code, and outputs the decoded packet, the present invention has a memory that inputs and delays the received packet to output a delayed packet, a syndrome generating circuit that inputs the received packet to output a syndrome, and an error-correcting circuit that inputs the delayed packet and the syndrome to output the decoded packet. The error-correcting circuit comprises an error-locator-polynomial/error-evaluator-polynomial calculating circuit that inputs the syndrome and outputs an error-locator-polynomial and an error-evaluator-polynomial and a correcting circuit that inputs the delayed packet, the error-locator-polynomial, and the error-evaluator-polynomial, obtains errors contained in the delayed packet from the error-locator-polynomial and the error-evaluator-polynomial, removes the errors from the delayed packet, and outputs the decoded packet. The error-locator-polynomial/error-evaluator-polynomial calculating circuit has a memory, to which a syndrome equation and initial values are input, and a Galois-field operations circuit that is connected to the memory with data input/output capability. The present invention is characterized in that the syndrome generating circuit and the error-correcting circuit perform parallel operation by pipelined processing for each packet, and the error-correcting circuit operates in synchronization with a clock with a period of 1/N the period of the received symbol clock, where $N \geq 1$, and N is an integer. Therefore the present invention accommodates high-speed processing with small-scale hardware.

Next, the Euclid's algorithms and apparatus in the second to seventh embodiments of the present embodiment are described in conjunction with figures.

Figure 20:
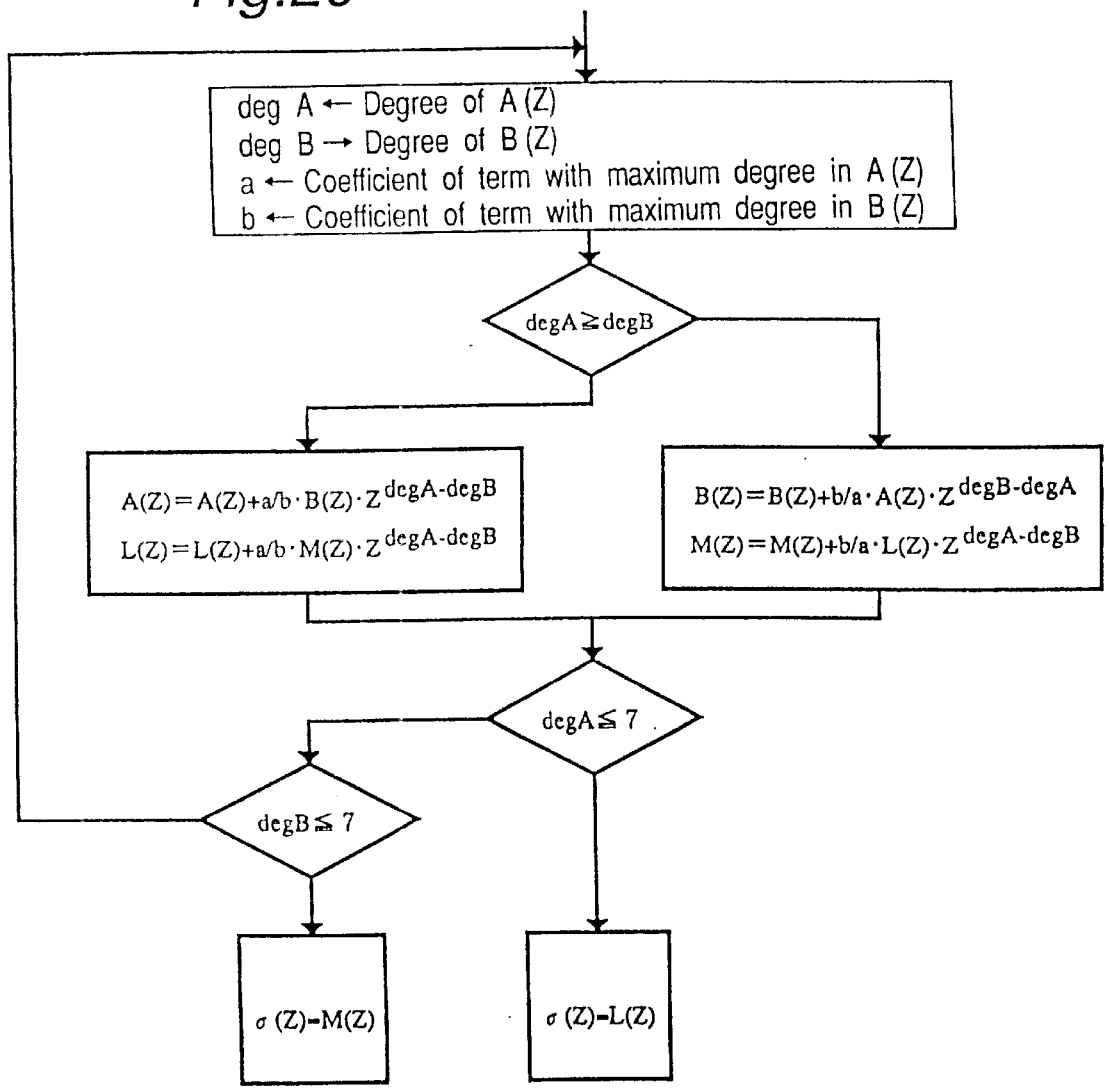
FIG. 20 is a flowchart illustrating a general Euclid's algorithm after initial setting.

The Euclid's algorithms and apparatus of the present invention can employ the general Euclid's algorithm after initial setting illustrated in FIG. 20. The features of the Euclid's algorithm and apparatus in the present invention lie in methods of initial setting. Therefore, the methods of initial setting are described in details, and the general Euclid's algorithm after initial setting is briefly described in conjunction with FIG. 20.

Second Embodiment

Figure 4:
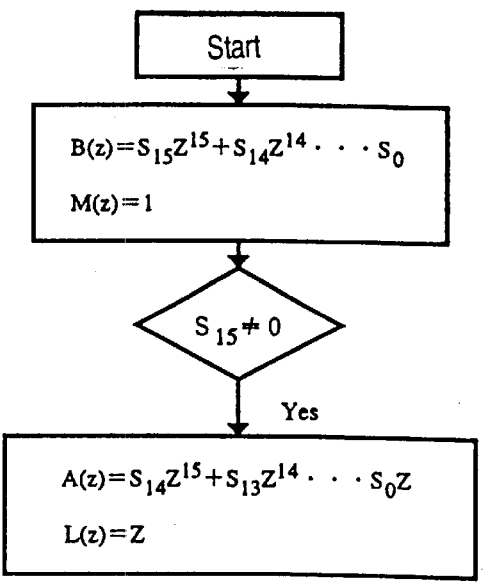
FIG. 4 is a flowchart illustrating the method of initial setting in the Euclid's algorithm in a second embodiment of the present invention.

FIG. 4 is a flowchart illustrating the method of initial setting in the Euclid's algorithm in a second embodiment of the present invention. In the Euclid's algorithm in the second embodiment of the present invention, according to the method of initial setting illustrated in FIG. 4, initial setting for the polynomials A(z), B(z), L(z), and M(z) is performed from the syndrome equation $$S(z) = s_{15}z^{15} + s_{14}Z^{14} + \ldots + s_0$$

based on a signal encoded with a Reed-Solomon code, where $s_{15}, \ldots, s_0$ are elements of the Galois field GF(28). Then according to the general Euclid's algorithm after initial setting illustrated in FIG. 16, Galois-field operations are performed to obtain the error-locator-polynomial σ(z). In the Galois-field operations, processing for reducing the degrees of the polynomials A(z) and B(z) is performed. When at least one of the degrees of the polynomials A(z) and B(z) becomes equal to or less than 7, the processing is terminated.

Examples of operations in the Euclid's algorithm in the second embodiment of the present invention illustrated in FIGS. 4 and 20 are described in the following.

A first example of operations in the Euclid's algorithm in the second embodiment of the present invention is described in the following. This example of operations uses the same syndrome equation as the one in the first example of operations in the Euclid's algorithm described previously. For the coefficients of the syndrome equation S(z), $s_{15}, \ldots, s_8 \neq 0$ in this case.

Syndrome.

$$S(z)=85z^{15}+EBz^{14}+E9z^{13}+A9z^{12}+F8z^{11}+AEz^{10}C\ 4z^9+14z^8+A7z^7+72z^6+A0z^5+58z^4+91z^3+51z\ ^25Fz+FF$$

After initial setting.

$$A(z) = EBz^{15} + E9z^{14} + A9z^{13} + F8z^{12} + AEz^{11} + C4z^{10} + 14z^9 + A7z^8 + 72z^7 + A0z^6 + 58z^5 + 91z^4 + 51z^3 + 5Fz^2 + FFz$$

$$B(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$$

$$L(Z) = z$$

$$M(Z) = 1$$

After first Galois-field operations $A(z) = 96z^{14} + 6z^{13} + 48z^{12} + A7z^{11} + 71z^{10} + 88z^9 + D4z^8 + C8z^7 + 20z^6 + E7z^5 + 27z^4 + C9z^3 + E6z^2 + 4Cz + C$ $B(z) = 85z^{15} + EBz^{14} + E9z^{13} + A9z^{12} + F8z^{11} + AEz^{10} + C4z^9 + 14z^8 + A7z^7 + 72z^6 + A0z^5 + 58z^4 + 91z^3 + 51z^2 + 5Fz + FF$ $L(Z) = z + 68$ $M(Z) = 1$ After second Galois-field operations $A(z) = 96z^{14} + 06z^{13} + 48z^{12} + A7z^{11} + 71z^{10} + 88z^9 + D4z^8 + C8z^7 + 20z^6 + E7z^5 + 27z^4 + C9z^3 + E6z^2 + 4Cz + 0C$ $B(z) = 91z^{14} + 18z^{13} + 3Bz^{12} + 4Dz^{11} + A4z^{10} + 3Ez^9 + BCz^8 + F6z^7 + 42z^6 + 6Bz^5 + 10z^4 + 41z^3 + 7z^2 + ABz + FF$ $L(Z) = z + 68$ $M(Z) = E0z^2 + A0z + 1$ After third Galois-field operations $A(z) = 71z^{13} + E1z^{12} + 41z^{11} + B7z^{10} + 9Fz^9 + 65z^8 + 6Dz^7 + 19z^6 + 61z^5 + 7Dz^4 + 9Az^3 + 14z^2 + 55z + A2$ $B(z) = 91z^{14} + 18z^{13} + 3Bz^{12} + 4Dz^{11} + A4z^{10} + 3Ez^9 + BCz^8 + F6z^7 + 42z^6 + 6Bz^5 + 10z^4 + 41z^3 + 7z^2 + ABz + FF$ $L(Z) = 2Bz^2 + 5Fz + 4E$ $M(Z) = E0z^2 + A0z + 1$ After fourth Galois-field operations $A(z) = 71z^{13} + E1z^{12} + 41z^{11} + B7z^{10} + 9Fz^9 + 65z^8 + 6Dz^7 + 19z^6 + 61z^5 + 7Dz^4 + 9Az^3 + 14z^2 + 55z + A2$ $B(z) = FEz^{13} + EBz^{12} + 37z^{11} + 49z^{10} + 6Az^9 + 61z^8 + CCz^7 + DCz^6 + B9z^5 + 8Bz^4 + 84z^3 + 42z^2 + A8z + FF$ $L(Z) = 2Bz^2 + 5Fz + 4E$ $M(Z) = 4Ez^3 + 49z^2 + BAz + 1$ After fifth Galois-field operations $A(z) = 59z^2 + 93$ $B(z) = FEz^{13} + EBz^{12} + 37z^{11} + 49z^{10} + 6Az^9 + 61z^8 + CCz^7 + DCz^6 + B9z^5 + 8Bz^4 + 84z^3 + 42z^2 + A8z + FF$ $L(Z) = 6Az^3 + 9Cz^2 + FEz + E$ $M(Z) = 4Ez^3 + 49z^2 + BAz + 1$ Result.

$\sigma(z) = L(Z) = 6Az^3 + 9Cz^2 + FEz + E$

The polynomials A(z), B(z), L(z), M(z) after initial setting in the present example are the polynomials A(z), B(z), L(z), M(z) after the first Galois-field operations in the first example of operations in the Euclidean algorithm of the prior example. As a result, the number of Galois field operations before obtaining the error-location polynomial σ(z) is five, that is, one less than in the first example of operations in the Euclidean algorithm of the prior example.

A second example of operations in the Euclidean algorithm in the second embodiment of the present invention is described in the following. This example of operations uses the same syndrome equation as the one in the second example of operations in the prior Euclidean algorithm described previously. For the coefficients of the syndrome equation S(z), s15≠0, and at least one of s14, . . . , s8 is 0 in this case.

Syndrome.

$S(z) = 9Fz^{15} + 94z^{12} + F4z^{11} + ECz^{10} + 6Dz^9 + 5Fz^8 + 27z^7 + 5Cz^6 + 96z^5 + 21z^4 + A0z^3 + BFz^2 + 7Fz + 46$

After initial setting $$A(z) = +94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$$

$$B(z) = 9Fz^{15} + 94z^{12} + F4z^{11} + ECz^{10} + 6Dz^9 + 5Fz^8 + 27z^7 + 5Cz^6 + 96z^5 + 21z^4 + A0z^3 + BFz^2 + 7Fz + 46$$

$$L(Z) = z$$

$$M(Z) = 1$$

After first Galois-field operations $$A(z) = 94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$$

$$B(z) = Bz^{14} + 2Ez^{13} + 81z^{12} + 91z^{11} + 38z^{10} + 2Fz^9 + FAz^8 + BDz^7 + FDz^6 + 41z^5 + C3z^4 + FDz^3 + BFz^2 + 7Fz + 46$$

$$L(Z) = z$$

$$M(Z) = 1Dz^3 + 1$$

After second Galois-field operations $$A(z) = 94z^{13} + F4z^{12} + ECz^{11} + 6Dz^{10} + 5Fz^9 + 27z^8 + 5Cz^7 + 96z^6 + 21z^5 + A0z^4 + BFz^3 + 7Fz^2 + 46z$$

$$B(z) = D1z^{13} + 43z^{12} + E9z^{11} + 2z^{10} + DCz^9 + E4z^8 + 8Ez^7 + 46z^6 + 40z^5 + ABz^4 + 60z^3 + A4z^2 + 7Fz + 46$$

$$L(Z) = z$$

$$M(Z) = 1Dz^3 + 1Cz^2 + 1$$

After third Galois-field operations $$A(z) = 79z^2 + 10z + 96$$

$$B(z) = D1z^{13} + 43z^{12} + E9z^{11} + 2z^{10} + DCz^9 + E4z^8 + 8Ez^7 + 46z^6 + 40z^5 + ABz^4 + 60z^3 + A4z^2 + 7Fz + 46$$

$$L(Z) = 84z^3 + 3Cz^2 + z + B8$$

$$M(Z) = 1Dz^3 + 1Cz^2 + 1$$

Result $$\sigma(z) = L(Z) = 84z^3 + 3Cz^2 + z + B8$$

The polynomials A(z), B(z), L(z), M(z) after initial setting in the present example are the polynomials A(z), B(z), L(z), M(z) after the first Galois-field operations in the second example of operations in the Euclid's algorithm of the prior example. As a result, the number of Galois field operations before obtaining the error-locator-polynomial σ(z) is three, that is, one less than in the second example of operations in the Euclid's algorithm of the prior example.

In this way, the Euclid's algorithm in the second embodiment of the present embodiment allows the execution of the Euclid's algorithm under the condition $s_{15} \neq 0$ for coefficients of the syndrome equation S(z) and reduces the number of Galois-field operations necessary for the execution of the Euclid's algorithm. Under the other conditions, the execution of the Euclid's algorithm is impossible. However, there is extremely little probability that some errors exist in the received signal, that is, the syndrome equation S(z)≠0, and the coefficient $s_{15}$ of the syndrome equation S(z) is 0. Therefore, there is no problem in practice.

As described above, the Euclid's algorithm in the second embodiment of the present invention allows the execution of the Euclid's algorithm depending on the coefficients of the syndrome equation S(z) and reduces the number of Galois-field operations necessary for the execution of the Euclid's algorithm, to accommodate an increase in the speed of processing.

The Euclid's algorithm in the second embodiment of the present invention has performed initial setting for the polynomials A(z) and L(z) as $$A(z) = s_{k-2}z^{k-1} + s_{k-3}z^{k-2} + \ldots + s_0 z,$$

$$L(z) = z,$$

when $s_{k-1} \neq 0$ for the coefficients in the syndrome equation $$S(z) = s_{k-1}z^{k-1} + s_{k-2}z^{k-2} + \ldots + s_0,$$

where k>0, k is an integer, and $s_{k-1}, \ldots, s_0$ are elements of a Galois field. By these means, the Euclid's algorithm in the second embodiment has allowed the execution of the Euclid's algorithm, under the condition $s_{k-1} \neq 0$ for the coefficients of the syndrome equation S(z), and reduced the number of Galois-field operations necessary for the execution. However, the condition on the coefficients of the syndrome equation S(z) may be different from the above. For example, even if, regardless of the coefficients of the syndrome equation S(z), the initial setting for the polynomials A(z) and L(z) is performed as $$A(z) = s_{k-2}z^{k-1} + s_{k-3}z^{k-2} + \ldots + s_0 z,$$

$$L(z) = z,$$

the execution of the Euclid's algorithm under the condition $s_{k-1} \neq 0$ for the coefficients of the syndrome equation S(z) is possible and the number of Galois-field operations necessary for the execution can be reduced.

The Euclid's algorithm in the second embodiment of the present invention is characterized in that, in the Euclid's algorithm that performs initial setting for the polynomials A(z), B(z), L(z), and M(z) from the syndrome equation $$S(z)=s_{k-1}z^{k-1}+s_{k-2}z^{k-2}+\ldots s_0,$$

where k>0, k is an integer, and $s_{k-1}, \ldots, s_0$ are elements of a Galois field, and obtains an error-locator-polynomial by performing Galois-field operations, the method of the initial setting sets the above polynomials as $$B(z)=s_{k-1}z^{k-1}+s_{k-2}z^{k-2}+\ldots +s_0,$$

$$M(z)=1,$$

and, depending on the coefficients of the syndrome equation S(z), as $$A(z)=s_{k-2}z^{k-1}+s_{k-3}z^{k-2}+\ldots +s_0z,$$

$$L(z)=z.$$

The Euclid's algorithm in the second embodiment allows the execution of the Euclid's algorithm, depending on the coefficients of the syndrome equation S(z), and reduces the number of Galois-field operations necessary for the execution of the Euclid's algorithm, to accommodate an increase in the speed of processing.

Third Embodiment

Figure 5:
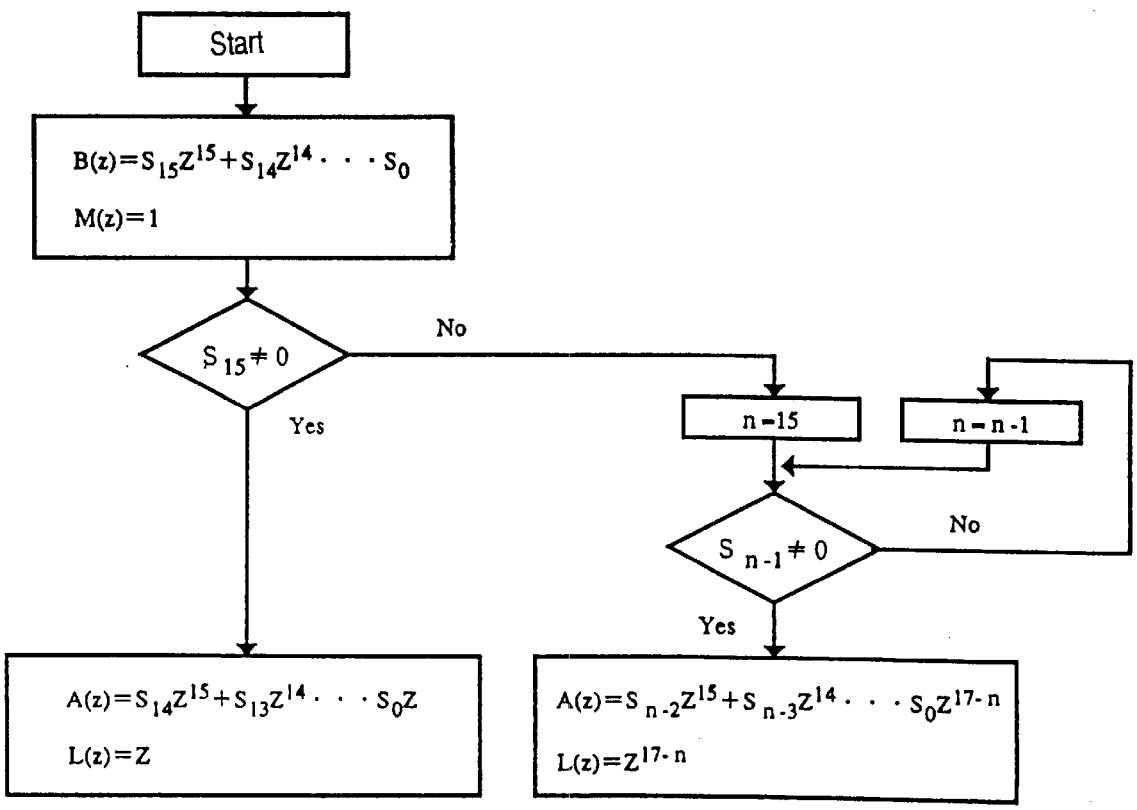
FIG. 5 is a flowchart illustrating the method of initial setting in the Euclid's algorithm in a third embodiment of the present invention.

FIG. 5 is a flowchart illustrating the method of initial setting in the Euclid's algorithm in a third embodiment of the present invention. In the Euclid's algorithm in the third embodiment of the present invention, according to the method of initial setting illustrated in FIG. 5, initial setting for the polynomials A(z), B(z), L(z), and M(z) is performed from the syndrome equation $$S(z)=s_{15}z^{15}+s_{14}z^{14}+\ldots +s_0$$

based on a signal encoded with a Reed-Solomon code, where $s_{15}, \ldots s_0$ are elements of the Galois field GF(28). Then according to the general Euclid's algorithm after initial setting illustrated in FIG. 20, Galois-field operations are performed to obtain the error-locator-polynomial σ(z). In the Galois-field operations, processing for reducing the degrees of the polynomials A(z) and B(z) is performed. When at least one of the degrees of the polynomials A(z) and B(z) becomes equal to or less than 7, the processing is terminated.

Examples of operations in the Euclid's algorithm in the third embodiment of the present invention illustrated in FIGS. 5 and 20 are described in the following.

The first example of operations in the Euclid's algorithm in the second embodiment of the present invention described previously is also a first example of operations in the Euclid's algorithm in the third embodiment of the present invention. This example of operations uses the same syndrome equation as the one in the first example of operations in the Euclid's algorithm described previously. For the coefficients of the syndrome equation S(z), $s_{15}, \ldots, s_8 \neq 0$ in this case.

The polynomials A(z), B(z), L(z), M(z) after initial setting in the present example are the polynomials A(z), B(z), L(z), M(z) after the first Galois-field operations in the first example of operations in the Euclid's algorithm of the prior example. As a result, the number of Galois field operations before obtaining the error-locator-polynomial σ(z) is five, that is, one less than in the first example of operations in the Euclid's algorithm of the prior example.

The second example of operations in the Euclid's algorithm in the second embodiment of the present invention described previously is also a second example of operations in the Euclid's algorithm in the third embodiment of the present invention. This example of operations uses the same syndrome equation as the one in the second example of operations in the prior Euclid's algorithm described previously. For the coefficients of the syndrome equation S(z), $s_{15} \neq 0$, and at least one of $s_{14}, \ldots, s_8$ is 0 in this case.

The polynomials A(z), B(z), L(z), M(z) after initial setting in the present example are the polynomials A(z), B(z), L(z), M(z) after the first Galois-field operations in the second example of operations in the Euclid's algorithm of the prior example. As a result, the number of Galois field operations before obtaining the error-locator-polynomial σ(z) is three, that is, one less than in the second example of operations in the Euclid's algorithm of the prior example.

A third example of operations in the Euclid's algorithm in the third embodiment of the present invention is described in the following. This example uses the same syndrome equation as the one in the third example of operations in the prior Euclid's algorithm described in the equations (3). For the coefficients of the syndrome equations S(z), $s_{15}= \ldots =s_n=0$ and $s_{n-1} \neq 0$, ($n \leq 15$; n is an integer) in this case.

Syndrome.

$$S(z)=FEz^{13}+D8z^{12}+9Fz^{11}+D8z^{10}+09z^9+9Dz^8+E7z^7+B7z^6+91z^5+0Bz^4+6Bz^3+79z^2+FDz+90$$

After initial setting $$A(z) = D8z^{15} + 9Fz^{14} + D8z^{13} + 09z^{12} + 9Dz^{11} + E7z^{10} + B7z^9 + 91z^8 + 0Bz^7 + 6Bz^6 + 79z^5 + FDz^4 + 90z^3$$

$$B(z) = FEz^{13} + D8z^{12} + 9Fz^{11} + D8z^{10} + 09z^9 + 9Dz^8 + E7z^7 + B7z^6 + 91z^5 + 0Bz^4 + 6Bz^3 + 79z^2 + FDz + 90$$

$$L(Z) = z^3$$

$$M(Z) = 1$$

$$A(z) = ECz^{14} + 7Az^{13} + 7Az^{12} + C1z^{11} + 83z^{10} + 4Dz^9 + F0z^8 + C1z^7 + F1z^6 + FAz^5 + C6z^4 + EDz^3 + A9z^2$$

$$B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$$

$$L(Z) = z^3 + 63z^2$$

$M(Z) = 1$

After second Galois-field operations $A(z) = 1Az^{13} + 87z^{12} + A1z^{11} + 87z^{10} + 2Cz^9 + 8Cz^8 + 43z^7 + FFz^6 + 62z^5 + z^4 + 22z^3 + 97z^2 + 40z$ $B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$ $L(Z) = z^3 + 63z^2 + 4Ez$ $M(Z) = 1$ After third Galois-field operations $A(z) = EDz^2 + EFz + FA$ $B(z) = FEz^{13} + D8z^{12} + 9Fz^{11} + D8z^{10} + 9z^9 + 9Dz^8 + E7z^7 + B7z^6 + 91z^5 + Bz^4 + 6Bz^3 + 79z^2 + FDz + 90$ $L(Z) = z^3 + 63z^2 + 4Ez + 98$ $M(Z) = 1$ Result $\sigma(z) = L(Z) = z^3 + 63z^2 + 4Ez + 98$ The polynomials A(z), B(z), L(z), M(z) after initial setting in the present example are the polynomials A(z), B(z), L(z), M(z) after the first Galois-field operations in the third example of operations in the Euclid's algorithm of the prior example. As a result, the number of Galois field operations before obtaining the error-locator-polynomial $\sigma(z)$ is three, that is, one less than in the third example of operations in the Euclid's algorithm of the prior example.

As described above, the Euclid's algorithm in the third embodiment of the present invention allows the execution of the Euclid's algorithm, regardless of the coefficients of the syndrome equation S(z), and reduces the number of Galois-field operations necessary for the execution of the Euclid's algorithm, so that the Euclid's algorithm in the third embodiment can accommodate an increase in the speed of processing.

The Euclid's algorithm in the third embodiment of the present invention is characterized in that, in the Euclid's algorithm that performs initial setting for the polynomials A(z), B(z), L(z), and M(z) from the syndrome equation $S(z) = s_{k-1}z^{k-1} + s_{k-2}z^{k-2} + \ldots + s_0$, where k>0, k is an integer, and $s_{k-1}, \ldots, s_0$ are elements of a Galois field, and obtains an error-locator-polynomial by performing Galois-field operations, the method of the initial setting sets the above polynomials as $B(z) = s_{k-1}z^{k-1} + s_{k-2}z^{k-2} + \ldots s_0$, $M(z) = 1$, and $A(z) = s_{n-2}z^{k-1} + s_{k-3}z^{k-2} + \ldots + s_0 z^{k-n+1}$, $L(z) = z^{k-n+1}$, if $s_{15} \ldots s_n = 0$ and $s_{n-1} \neq 0$, (n≦15; n is an integer), $A(z) = s_{k-2}z^{k-1} + s_{k-3}z^{k-2} + \ldots + s_0 z$, $L(z) = z$, otherwise.

The Euclid's algorithm in the third embodiment allows the execution of the execution of the Euclid's algorithm, regardless of the coefficients of the syndrome equation S(z), and reduces the number of Galois-field operations necessary for the execution of the Euclid's algorithm, to accommodate an increase in the speed of processing.

Fourth Embodiment

Figure 6:
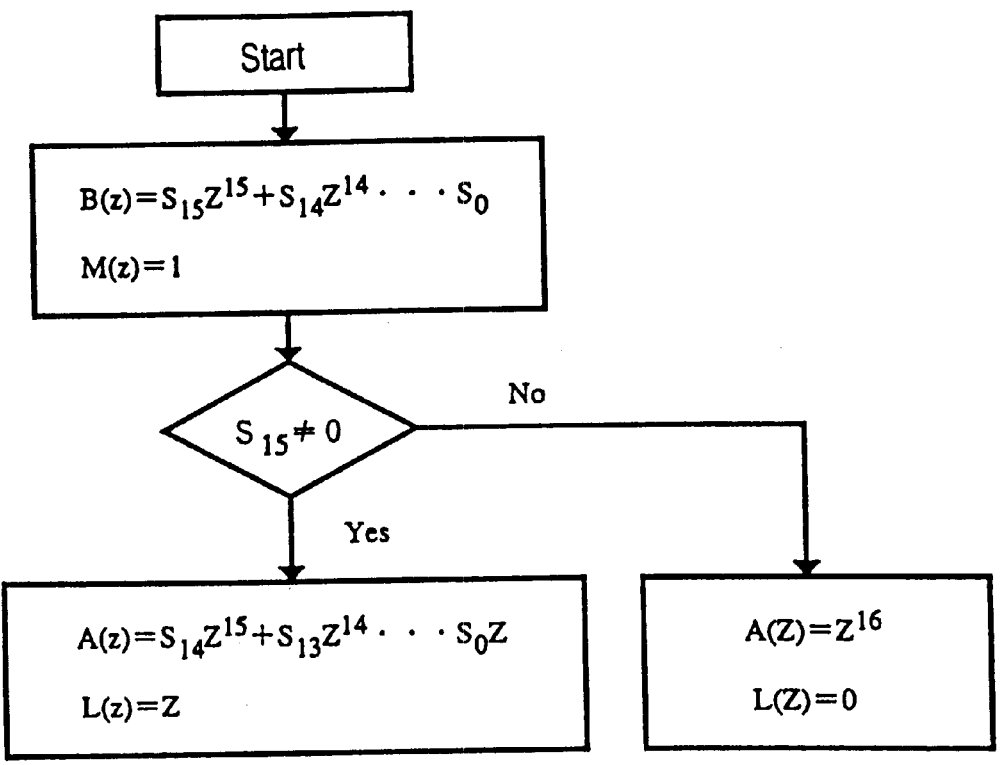
FIG. 6 is a flowchart illustrating the method of initial setting in the Euclid's algorithm in a fourth embodiment of the present invention.

FIG. 6 is a flowchart illustrating the method of initial setting in the Euclid's algorithm in a fourth embodiment of the present invention. In the Euclid's algorithm in the fourth embodiment of the present invention, according to the method of initial setting illustrated in FIG. 6, initial setting for the polynomials A(z), B(z), L(z), and M(z) is performed from the syndrome equation $S(z) = s_{15}z^{15} + s_{14}z^{14} + \ldots + s_0$ based on a signal encoded with a Reed-Solomon code, where $s_{15}, \ldots, s_0$ are elements of the Galois field GF($2^8$) Then according to the general Euclid's algorithm after initial setting illustrated in FIG. 20, Galois-field operations are performed to obtain the error-locator-polynomial $\sigma(z)$. In the Galois-field operations, processing for reducing the degrees of the polynomials A(z) and B(z) is performed. When at least one of the degrees of the polynomials A(z) and B(z) becomes equal to or less than 7, the processing is terminated.

Examples of operations in the Euclid's algorithm in the fourth embodiment of the present invention illustrated in FIGS. 6 and 20 are described in the following.

The first example of operations in the Euclid's algorithm in the second embodiment of the present invention described previously is also a first example of operations in the Euclid's algorithm in the fourth embodiment of the present invention. This example of operations uses the same syndrome equation as the one in the first example of operations in the prior Euclid's algorithm described previously. For the coefficients of the syndrome equation S(z), $s_{15}, \ldots s_8 \neq 0$ in this case.

The polynomials A(z), B(z), L(z), M(z) after initial setting in the present example are the polynomials A(z), B(z), L(z), M (z) after the first Galois-field operations in the first example of operations in the Euclid's algorithm of the prior example. As a result, the number of Galois field operations before obtaining the error-locator-polynomial σ(z) is five, that is, one less than in the first example of operations in the Euclid's algorithm of the prior example.

The second example of operations in the Euclid's algorithm in the second embodiment of the present invention described previously is also a second example of operations in the Euclid's algorithm in the fourth embodiment of the present invention. This example of operations uses the same syndrome equation as the one in the second example of operations in the prior Euclid's algorithm shown in the equations (1). For the coefficients of the syndrome equation S(z), $s_{15} \neq 0$, and at least one of the coefficients $s_{14}, \ldots, s_8$ is 0 in this case.

The polynomials A(z), B(z), L(z), M(z) after initial setting in the present example are the polynomials A(z), B(z), L(z), M(z) after the first Galois-field operations in the second example of operations in the Euclid's algorithm of the prior example. As a result, the number of Galois field operations before obtaining the error-locator-polynomial σ(z) is three, that is, one less than in the second example of operations in the Euclid's algorithm of the prior example.

A third example of operations in the Euclid's algorithm in the present embodiment is described in the following, corresponding to the third example of operations in the Euclid's algorithm described previously. This example uses the same syndrome equation as the one in the third example of operations in the prior Euclid's algorithm. For the coefficients of the syndrome equations S(z), $S_{15} = \ldots = s_n = 0$ and $s_{n-1} \neq 0$, where $n \leq 15$, and n is an integer, in this case. This example of operations is completely the same as the third example of operations in the Euclid's algorithm of the prior example. As a result, the number of Galois field operations before obtaining the error-locator-polynomial σ(z) is the same as in the third example of operations in the Euclid's algorithm of the prior example.

In this way, the Euclid's algorithm in the fourth embodiment of the present invention has a case in which the number of Galois-field operations is the same as in the prior example and a case in which the number of Galois-field operations is less than in the prior example.

However, the case in which the number of Galois-field operations is the same as in the prior example is a special case in which, for the coefficient of the syndrome equations S(z), $s_{15} = \ldots = s_n = 0$, and $s_{n-1} \neq 0$, where $n \leq 15$, and n is an integer, as in the above third example of operations. In the other cases, that is, in the case in which $s_{15} \neq 0$, the number of Galois-field operation is reduced, as shown described in the above first and second example of operations.

As described above, the Euclid's algorithm in the fourth embodiment of the present invention allows the execution of the Euclid's algorithm, regardless of the coefficients of the syndrome equation S(z), and reduces the number of Galois-field operations necessary for the execution of the Euclid's algorithm, depending on the coefficients of the syndrome equation S(z), so that the Euclid's algorithm in the fourth embodiment can accommodate an increase in the speed of processing.

The Euclid's algorithm in the fourth embodiment of the present invention has performed initial setting for the polynomials A(z) and L(z) as $A(z) = z^k$ and $L(z) = 1$, if $s_{k-1} = 0$, $A(z) = s_{k-2}z^{k-1} + s_{k-3}z^{k-2} + \ldots + s_0 z$ and $L(z) = z$, otherwise, for the coefficient $s_{k-1}$ of the syndrome equation $$S(z) = s_{k-1}z^{k-1} + s_{k-2}z^{k-2} + \ldots + s_0,$$

where k>0, k is an integer, and $s_{k-1}, \ldots, s_0$ are element of a Galois field. By these means, the Euclid's algorithm in the fourth embodiment has allowed the number of Galois-field operations necessary for the execution of the Euclid's algorithm to be reduced under the condition $s_{k-1} \neq 0$ for the coefficients of the syndrome equation S(z). However, the condition on the coefficients of the syndrome equation S(z) may be different from the above. For example, if the initial setting for A(z) and L(z) is performed as $A(z) = z^k$, $L(z) = 1$, if at least one of the coefficients $s_{k-1}, \ldots, s_{k/2}$ is 0, $A(z) = s_{k-2}z^{k-1} + s_{k-3}z^{k-2} + \ldots + s_0 z$, $L(z) = z$, otherwise, then the number of Galois-field operations necessary for the execution can be reduced under the condition $s_{k-1}, \ldots, s_{k-2} \neq 0$ for the coefficients of the syndrome equation S(z).

The Euclid's algorithm in the fourth embodiment of the present invention is characterized in that, in the Euclid's algorithm that performs initial setting for the polynomials A(z), B(z), L(z), and M(z) from the syndrome equation $$S(z) = s_{k-1}z^{k-1} + s_{k-2}z^{k-2} + \ldots + s_0,$$

where k>0, k is an integer, $s_{k-1}, \ldots, s_0$ are elements of a Galois field, and obtains an error-locator-polynomial by performing Galois-field operations, the method of the initial setting sets the above polynomials as $$B(z) = s_{k-1}z^{k-1} + s_{k-2} + \ldots + s_0,$$

$$M(z) = 1,$$

and as $A(z) = s_{k-2}z^{k-1} + s_{k-3}z^{k-2} + \ldots + s_0 z$, $L(z) = z$, depending on the coefficients of the syndrome equation S(z), $A(z) = z^k$, $L(z) = 1$, if $s_{k-1} = 0$ for the coefficients of the syndrome equation S(z). By these means, the Euclid's algorithm in the fourth embodiment allows the execution of the Euclid's algorithm, regardless of the coefficients of the syndrome equation S(z), and reduces the number of Galois-field operations necessary for the execution of the Euclid's algorithm, depending on the coefficients of the syndrome equation S(z), to accommodate an increase in the speed of processing.

Fifth Embodiment

Figure 7:
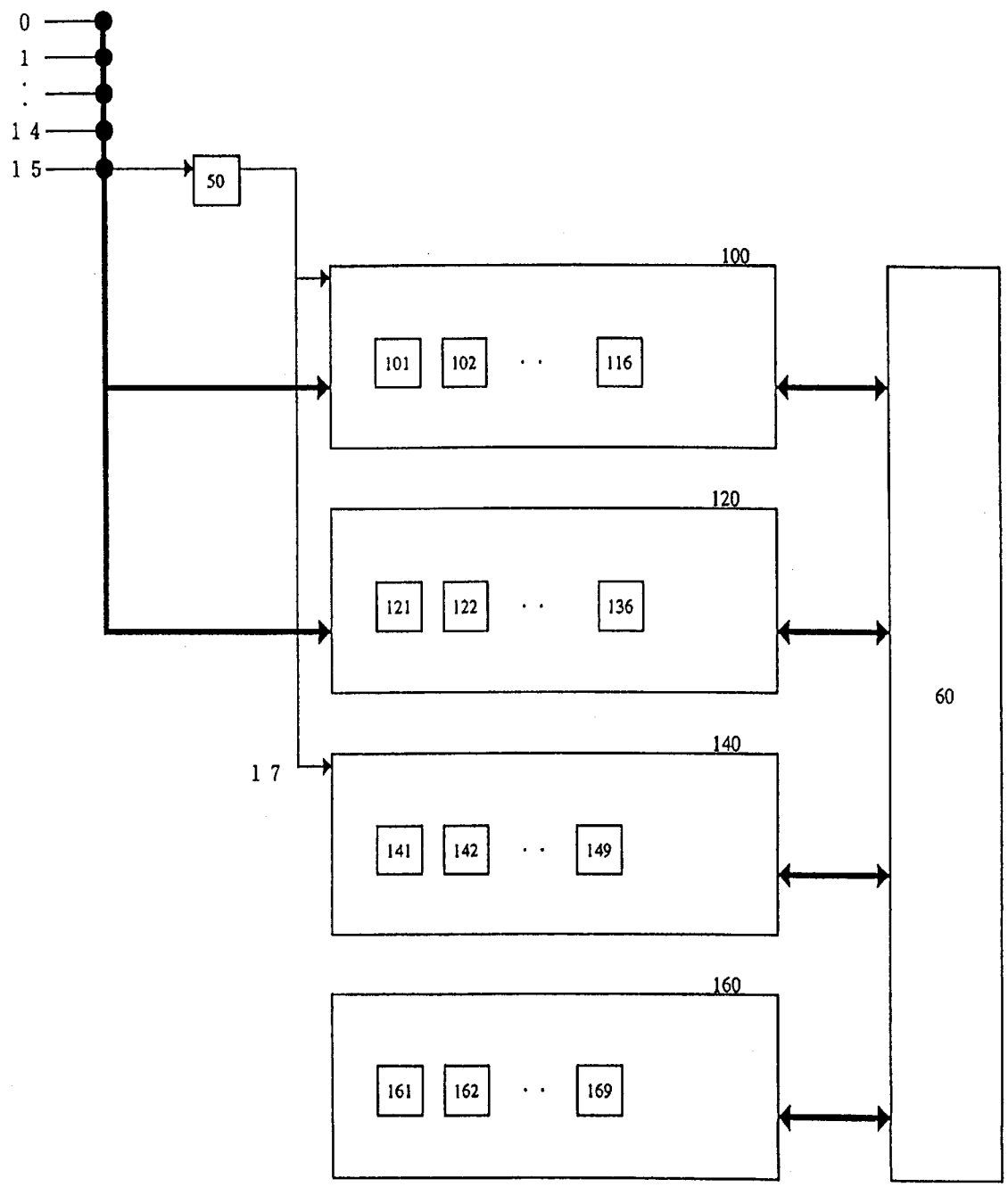
FIG. 7 is a block diagram illustrating the construction of the Euclid's algorithm apparatus in a fifth embodiment of the present invention.

FIG. 7 is a block diagram illustrating the Euclid's algorithm apparatus in a fifth embodiment of the present invention.

In FIG. 7, 0 to 15 are a syndrome that represents the coefficients $s_0$ to $s_{15}$ of the syndrome equation $$S(z) = s_{15}z^{15} + s_{14}Z^{14} + \ldots + s_0,$$

where $s_{15}, \ldots, s_0$ are elements of the Galois field GF(28).

17 is a monitoring signal.

50 is a syndrome monitoring device that inputs the syndrome value 15 and lets the monitoring signal 17 be 0 if the value of the syndrome 15 is 0 and lets the syndrome signal 17 be 1 otherwise, to output the monitoring signal 17.

60 is a Galois-field operations device that performs Galois-field operations.

100 is a polynomial storage device that consists of registers 101 to 116, inputs the value 0 and the syndrome 0, . . . , 14 respectively to the register 101 and registers 102 to 116, during initial setting, if the monitoring signal 17 is 1, and transfers data to and from the Galois-field operations device 60, after initial setting.

120 is a polynomial storage device that consists of registers 121 to 136, inputs the syndrome 0, ..., 15 respectively to the registers 121 to 136, during initial setting, and transfers data to and from the Galois-field operations device 60, after initial setting.

140 is a polynomial storage device that consists of registers 141 to 149, inputs the values 0, 1, 0 respectively to the registers 141, 142, and 143 to 149, during initial setting, if the monitoring signal 17 is 1, and transfers data to and from the Galois-field operations device 60, after initial setting.

160 is a polynomial storage device that consists of registers 161 to 169, inputs the values 1, 0 respectively to the register 161 and the registers 162 to 169, during initial setting, and transfers data to and from the Galois-field operations device 60, after initial setting.

The operation of the Euclid's algorithm apparatus of the present invention constructed in this way isdescribed in the following.

The Euclid's algorithm apparatus in the fifth embodiment of the present invention inputs the syndromeequation $$S(z)=s_{15}z^{15}+s_{14}Z^{14}+\ldots+s_0,$$

where $s_{15}, \ldots, s_0$ are elements of the Galois field GF(2$^8$).

During initial setting, the Euclid's algorithm apparatus stores the polynomials $$B(z)=s_{15}z^{15}+s_{14}Z^{14}+\ldots+s_0,$$

$$M(z)=1$$

respectively in the polynomial storage devices 120 and 160. If, for the coefficient of the syndrome equation S(z), $s_{15}\neq 0$, then the Euclid's algorithm apparatus stores the polynomials $$A(z)=s_{14}z^{15}+s_{13}z^{14}+\ldots+s_0z,$$

$$L(z)=z$$

respectively in the polynomial storage devices 100, 140.

The polynomial storage devices 100, 120, 140, 160 respectively stores the polynomials A(z), B(z), L(z), M(z) by storing their coefficients. The registers 101, 121, 141, 161 are respectively the places of the terms of the degree 0.

After the initial setting, data is transferred between the polynomial storage devices 100, 120, 140, 160 and the Galois-field operations device 60, which performs Galois-field operations a plurality of times.

As a result, an error-locator-polynomial σ(z) is stored in the polynomial storage device 140 or 160.

The Euclid's algorithm apparatus in the fifth embodiment of the present invention is characterized by its method of initial setting, so that the operation duringinitial setting is detailed in the following in conjunctionwith examples of operations.

A first example of operations in the Euclid's algorithm apparatus in the fifth embodiment of the presentinvention is described in the following. This example ofoperations uses the same syndrome equation as the one inthe first example of operations in the prior Euclid's algorithm described previously. For the coefficients ofthe syndrome equation S(z)a, $s_{15}, \ldots, s_8\neq 0$ in this case.

Since the value of the syndrome 15 is 85, the syndrome monitoring device 50 outputs 1 as the monitoring signal 17.

The polynomial storage device 120 inputs the syndrome 0, ..., 15 respectively to the registers 121 to 136. The polynomial storage device 160 inputs the values 1, 0 respectively to the register 161 and the registers 162 to 169.

Since the monitoring signal 17 is 1, the polynomial storage device 100 inputs the value 0 and syndrome 0, ..., 14 respectively to the register 101 and the registers 102 to 116. The polynomial storage device 140 inputs the values 0, 1, 0 respectively to the registers 141, 142, and 143 to 149.

The states of the polynomial storage devices 100, 120, 140, 160 at this point are shown in FIG. 8.

The initial setting has thus been finished.

The polynomials A(z), B(z), L(z), M(z) stored in the polynomial storage devices 100, 120, 140, 160 after initial setting in the present example are the polynomials A(z), B(z), L(z), M(z) after the first Galois-field operations in the first example of operations in the Euclid's algorithm of the prior example. As a result, the number of Galois field operations before obtaining the error-locator-polynomial σ(z) is five, that is, one less than in the first example of operations in the Euclid's algorithm of the prior example.

A second example of operations in the Euclid's algorithm apparatus in the fifth embodiment of the present invention is described in the following.

This example of operations uses the same syndrome equation as the one in the second example of operations in the Euclid's algorithm described previously. For the coefficients of the syndrome equation S(z), $s_{15}\neq 0$, and at least one of $s_{14}, \ldots, s_8$ is 0 in this case.

Since the value of the syndrome 15 is 9F, the syndrome monitoring device 50 outputs 1 as the monitoring signal 17.

The polynomial storage device 120 inputs the syndrome 0, ..., 15 respectively to the registers 121 to 136. The polynomial storage device 160 inputs the values 1, 0 respectively to the register 161 and the registers 162 to 169.

Since the monitoring signal 17 is 1, the polynomial storage device 100 inputs the value 0 and syndrome 0, ..., 14 respectively to the register 101 and the registers 102 to 116. The polynomial storage device 140 inputs the values 0, 1, 0 respectively to the registers 141, 142, and 143 to 149.

The states of the polynomial storage devices 100, 120, 140, 160 at this point are shown in FIG. 9.

The initial setting has thus been finished.

The polynomials A(z), B(z), L(z), M(z) stored in the polynomial storage devices 100, 120, 140, 160 after initial setting in the present example are the polynomials A(z), B(z), L(z), M(z) after the first Galois-field operations in the second example of operations in the Euclid's algorithm of the prior example. As a result, the number of Galois field operations before obtaining the error-locator-polynomial σ(z) is three, that is, one less than in the second example of operations in the Euclid's algorithm of the prior example.

In this way, the Euclid's algorithm apparatus in the fifth embodiment of the present embodiment allows the execution of the Euclid's algorithm under the condition $s_{15}\neq 0$ for coefficients of the syndrome equation S(z) and reduces the number of Galois-field operations necessary for the execution of the Euclid's algorithm. Under the other conditions, the execution of the Euclid's algorithm is impossible. However, there is extremely little probability that some errors exist in the received signal, that is, the syndrome equation S(z)≠0, and the coefficient $s_{15}$ of the syndrome equation S(z) is 0. Therefore, there is no problem in practice.

As described above, the Euclid's algorithm apparatus in the fifth embodiment of the present invention allows the execution of the Euclid's algorithm depending on the coefficients of the syndrome equation S(z) and reduces the number of Galois-field operations necessary for the execution of the Euclid's algorithm, to accommodate an increase in the speed of processing.

The Euclid's algorithm apparatus in the fifth embodiment of the present invention has stored the polynomials A(z) and L(z)

$$A(z)=s_{k-2}z^{k-1}+s_{k-3}z^{k-2}+\ldots+s_0z,$$

$$L(z)=z,$$

respectively in the polynomial storage devices A and L, if $s_{k-1} \neq 0$ for the coefficients of the syndrome equation $$S(z) = s_{k-1} z^{k-1} + s_{k-2} z^{k-2} + \ldots + s_0,$$

where k>0, k is an integer, and $s_{k-1}, \ldots, s_0$ are elements of a Galois field. By these means, the Euclid's algorithm apparatus in the fifth embodiment has allowed the execution of the Euclid's algorithm under the condition $s_{k-1} \neq 0$ for the coefficients of the syndrome equation S(z) and has reduced the number of Galois-field operations necessary for the execution. However, the condition on the coefficients of the syndrome equation S(z) may be different from the above. For example, even if, regardless of the coefficients of the syndrome equation S(z), the polynomials $$A(z) = s_{k-2} z^{k-1} + s_{k-3} z^{k-2} + \ldots + s_0 z,$$

$$L(z) = z,$$

are stored respectively in the polynomial storage devices A and L, the execution of the Euclid's algorithm under the condition $s_{k-1} \neq 0$ for coefficients of the syndrome equation S(z) is possible and the number of Galois-field operations necessary for the execution can be reduced.

The Euclid's algorithm apparatus in the fifth embodiment of the present invention is characterized in that, in an Euclid's algorithm apparatus that has as its input the syndrome equation $$S(z) = s_{k-1} z^{k-1} + s_{k-2} z^{k-2} + \ldots + s_0,$$

where k>0, k is an integer, and $s_{k-1}, \ldots, s_0$ are elements of a Galois field, has polynomial storage devices A, B, L, M and a Galois-field operations device, performs the initial setting of the polynomial storage devices A, B, L, M, depending on the syndrome equation, performs Galois-field operations by using the polynomial storage devices A, B, L, M and the Galois-field operations device, and obtains the error-locator-polynomial, the Euclid's algorithm apparatus, during initial setting, stores the polynomial $$B(z) = s_{k-1} z^{k-1} + s_{k-2} z^{k-2} + \ldots + s_0$$

in the polynomial storage device B, stores the polynomial $$M(z) = 1$$

in the polynomial storage device M, and, depending on the coefficients of the syndrome equation S(z), stores the polynomial $$A(z) = s_{k-2} z^{k-1} + s_{k-3} z^{k-2} + \ldots + s_0 z$$

in the polynomial storage device A and stores the polynomial $$L(z) = z$$

in the polynomial storage device L. The Euclid's algorithm apparatus allows the execution of the Euclid's algorithm depending on the coefficients of the syndrome equation S(z) and reduces the number of Galois-field operations necessary for the execution of the Euclid's algorithm, to accommodate an increase in the speed of processing.

Sixth Embodiment

Figure 10:
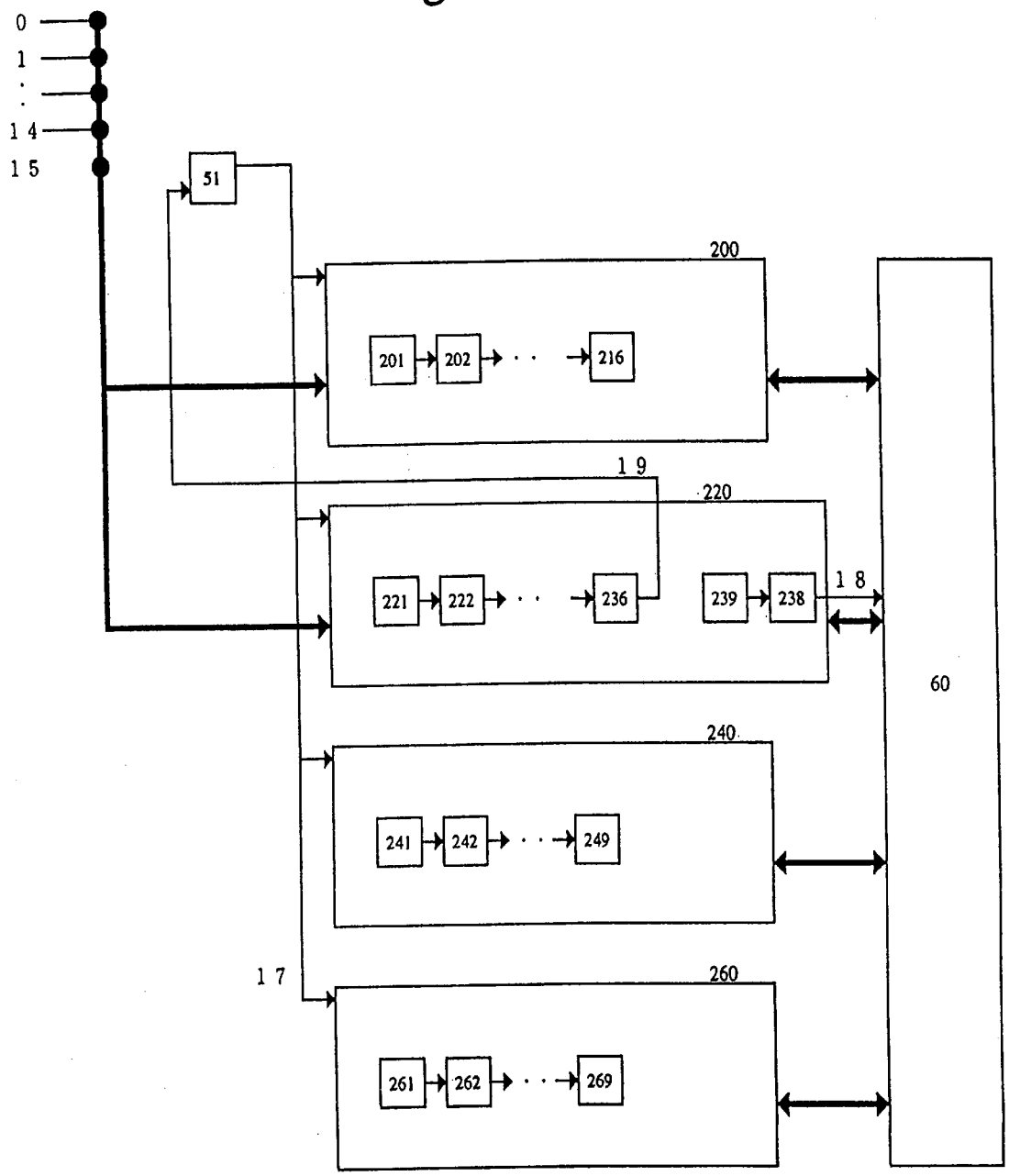
FIG. 10 is a block diagram illustrating the construction of the Euclid's algorithm apparatus in a sixth embodiment of the present invention.

FIG. 10 is a block diagram illustrating the Euclid's algorithm apparatus in a sixth embodiment of the present invention.

In the Euclid's algorithm apparatus in the sixth embodiment of the present invention, the constructions regarding the syndrome 0, . . . , 15, the monitoring signal 17, and the Galois-field operations device 60 are completely the same as the constructions in the Euclid's algorithm apparatus in the fifth embodiment of the present invention, illustrated in FIG. 7, so that their descriptions are omitted from here.

18 is the degree of B(z).

19 is the coefficient of the term with the highest degree in B(z).

51 is a syndrome monitoring device that inputs the coefficient 19 of the term with the highest degree, lets the monitoring signal 17 be 0 if the value of the coefficient 19 of the term with the highest degree is 0, and lets the syndrome signal 17 be 1 otherwise, to output the monitoring signal 17.

200 is a polynomial storage device that consists of registers 201 to 216, inputs the value 0 and the syndrome 0, . . . , 14 respectively to the register 201 and the registers 202 to 216, during initial setting, and, if the monitoring signal 17 is 0, respectively shifts the data stored in the registers 201, . . . , 216 to the right (in the direction of increasing indices) until the monitoring signal 17 becomes 1, and, after initial setting, transfers data to and from the Galois-field operations device 60.

220 is a polynomial storage device that consists of registers 221 to 236, a register 239, and an inverter device 238, outputs the data stored in the register 236 as the coefficient 19 of the term with the highest degree in B(z), inverts the data stored in the register 239 by the inverter device 238 to output the result as the degree 18 of B(z), and inputs the syndrome 0, . . . , 15 and the value 0 respectively to the registers 221 to 236 and the register 239, during initial setting, and, if the monitoring signal 17 is 0, respectively shifts the data stored in the registers 201, . . . , 216 to the right (in the direction of increasing indices) until the monitoring signal 17 becomes 1, after initial setting, increments the value stored in the register 219 by the number of shifts, and transfers data to and from the Galois-field operations device 60.

240 is a polynomial storage device that consists of registers 241 to 249, inputs the values 0, 1, 0 respectively to the registers 241, 242, and 243 to 249, during initial setting, and, if the monitoring signal 17 is 0, respectively shifts the data stored in the registers 241, . . . , 249 to the right (in the direction of increasing indices) until the monitoring signal 17 becomes 1, and, after initial setting, transfers data to and from the Galois-field operations device 60.

260 is a polynomial storage device that consists of registers 261 to 269, inputs the values 1, 0 respectively to the register 261 and the registers 262 to 269, during initial setting, and, if the monitoring signal 17 is 0, respectively shifts the data stored in the registers 261, . . . , 269 to the right (in the direction of increasing indices) until the monitoring signal 17 becomes 1, and, after initial setting, transfers data to and from the Galois-field operations device 60.

The operation of the Euclid's algorithm apparatus in the sixth embodiment of the present invention constructed in this way is described in the following.

The Euclid's algorithm apparatus in the sixth embodiment of the present invention inputs the syndrome equation $$S(z) = s_{15} z^{15} + s_{14} Z^{14} + \ldots + s_0,$$

where $s_{15}, \ldots, s_0$ are elements of the Galois field GF($2^8$).

During initial setting, the Euclid's algorithm apparatus stores the polynomials $$B(z) = s_{15} z^{15} + s_{14} Z^{14} + \ldots + s_0,$$

$$M(z) = 1$$

respectively in the polynomial storage devices 220 and 260.

If, for the coefficients of the syndrome equation S(z), $s_{15}= \ldots =s_n=0$ and $s_{n-1}\neq 0$, where n<15, and n is an integer, then the Euclid's algorithm apparatus stores the polynomials $$A(z)=s_{n-2}z^{15}+s_{n-3}z^{14}+ \ldots +s_0z^{17-n},$$

$$L(z)=z^{17-n},$$

respectively in the polynomial storage devices 200, 240. Otherwise, the Euclid's algorithm apparatus stores the polynomials $$A(z)=s_{14}Z^{15}+s_{13}Z^{14}+ \ldots +s_0Z,$$

$$L(z)=z.$$

respectively in the polynomial storage devices 200, 240.

The polynomial storage devices 200, 240 store the polynomials A(z), L(z) by storing their coefficients. The registers 201 and 241 are respectively the places of the terms of the degree 0 in the polynomials A(z) and L(z).

The polynomial storage device 220 stores the polynomial B(z) by storing the coefficients of the polynomial B(z) in the registers 221 to 236 and by storing the place of the term with degree 0 in the polynomial B(z) in the register 239. If the values stored in the register 239 are 0, . . . , 15 (decimal numbers), then the registers 231, . . . , 236 are respectively the places of the term with degree 0 in the polynomial B(z).

The polynomial storage device 260 stores the polynomial M(z) by storing the coefficients of the polynomial M(z) in the registers 261 to 269 and by storing the place of the term with degree 0 in the polynomial M(z) in the register 239 within the polynomial memory device 220. If the values stored in the register 239 are 0, . . . , 8 (decimal numbers), then the registers 261, . . . , 269 are respectively the places of the term with degree 0 in the polynomial B(z).

After the initial setting, data is transferred between the polynomial storage devices 200, 220, 240, 260 and the Galois-field operations device 60, which performs Galois-field operations a plurality of times.

As a result, an error-locator-polynomial σ(z) is stored in the polynomial storage device 240 or 260.

The Euclid's algorithm apparatus in the sixth embodiment of the present invention is characterized by its method of initial setting, so that the operation during initial setting is detailed in the following in conjunction with examples of operations.

A first example of operations in the Euclid's algorithm apparatus in the sixth embodiment of the present invention is described in the following. This example of operations uses the same syndrome equation as the one in the first example of operations in the prior Euclid's algorithm described previously. For the coefficients of the syndrome equation S(z) , $s_{15}, \ldots , s_8 \neq 0$ in this case.

First, the polynomial storage device 200 inputs the value 0 and the syndrome 0, . . . , 14 respectively to the register 201 and the registers 202 to 216. The polynomial storage device 220 inputs the syndrome 0, . . . , 15 and the value 0 respectively to the registers 221 to 236 and the register 239. The polynomial storage device 240 inputs the values 0, 1, 0 respectively to the registers 241, 242, and 243 to 249. The polynomial storage device 260 inputs the values 1, 0, 0 respectively to the registers 261, 262 to 269, and 279. The coefficient 19 of the term with the highest degree in B(z) is the value 85.

Since the value of the coefficient 19 of the term with the highest degree in B(z) is 85, the syndrome monitoring device 51 outputs 1 as the monitoring signal 17. Since the monitoring signal 17 is 1, the shifting or incrementing is not performed.

Figure 11:
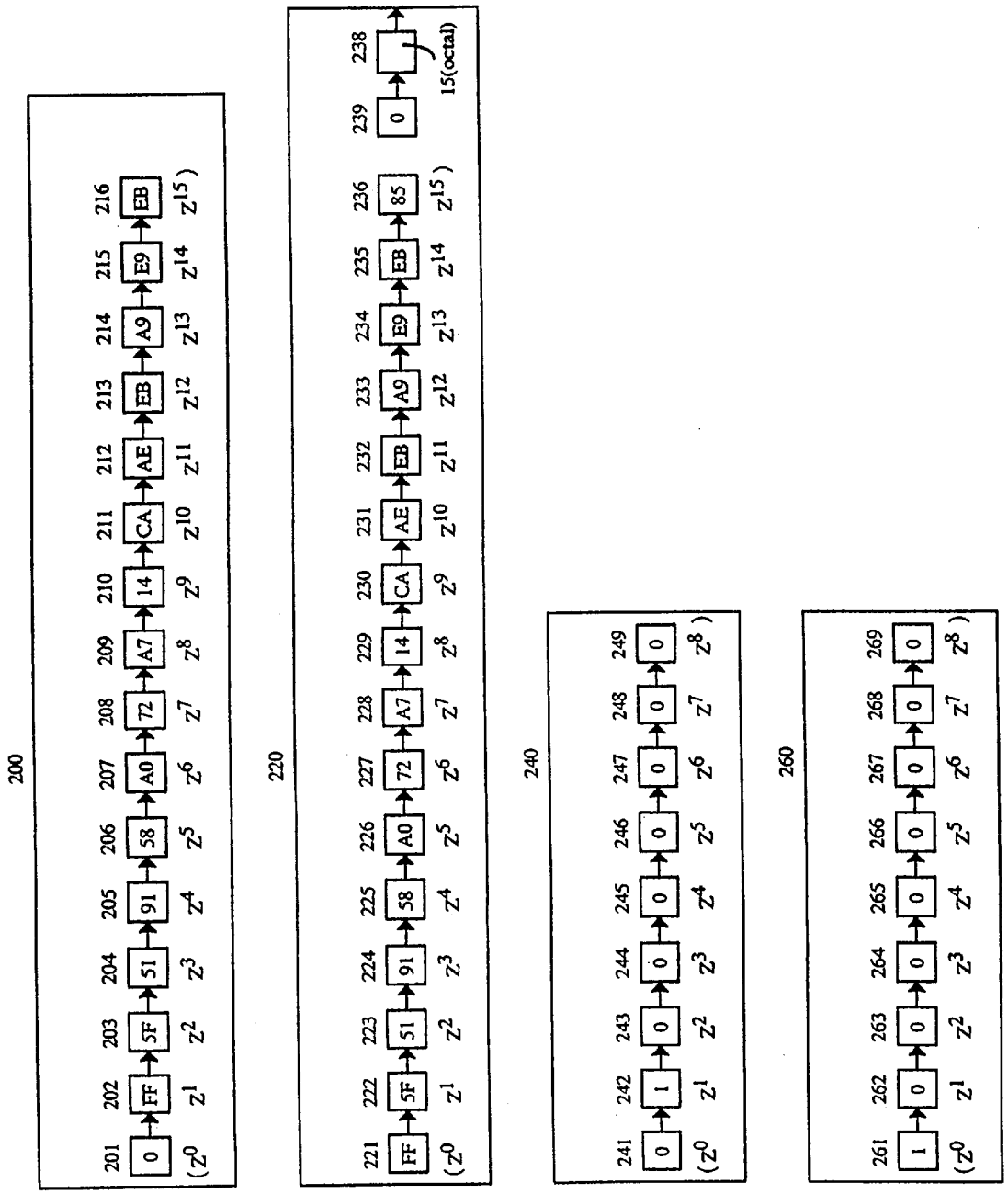
FIG. 11 is a state diagram of the polynomial storage devices in a first operation example of the same Euclid's algorithm apparatus.

The states of the polynomial storage devices 200, 220, 240, 260 at this point are shown in FIG. 11.

The initial setting has thus been finished.

The polynomials A(z), B(z), L(z), M(z) stored in the polynomial storage devices 200, 220, 240, 260 after initial setting in the present example of operations are the polynomials A(z), B(z), L(z), M(z) after the first Galois-field operations in the first example of operations in the Euclid's algorithm of the prior example. As a is result, the number of Galois field operations before obtaining the error-locator-polynomial σ(z) is five, that is, one less than in the first example of operations in the Euclid's algorithm of the prior example.

Also, the coefficient 19 of the term with the highest degree in B(z) is the value 85, which is the coefficient of the term with the highest degree in the polynomial B(z).

Further, the degree 18 of the polynomial B(z) is the value 15 (decimal number), which is the degree of the polynomial B(z).

These coefficient 19 of the term with the highest degree in B(z) and degree 18 of B(z) can be directly used in the first Galois-field operations, as shown in the flowchart of FIG. 20 of the general Euclid's algorithm after initial setting. Therefore, the number of Galois-field operations in the first Galois-field operations becomes fewer.

A second example of operations in the Euclid's algorithm apparatus in the sixth embodiment of the present invention is described in the following.

This example of operations uses the same syndrome equation as the one in the second example of operations in the prior Euclid's algorithm described previously. For the coefficients of the syndrome equation S(z), $s_{15}\neq 0$, and at least one of $s_{14}, \ldots , s_8$ is 0 in this case.

First, the polynomial storage device 200 inputs the value 0 and the syndrome 0, . . . , 14 respectively to the register 201 and the registers 202 to 216. The polynomial storage device 220 inputs the syndrome 0, . . . , 15 and the value 0 respectively to the registers 221 to 226 and the register 239. The polynomial storage device 240 inputs the values 0, 1, 0 respectively to the registers 241, 242, and 243 to 249. The polynomial storage device 260 inputs the values 1, 0 respectively to the register 261 and the registers 262 to 269. The coefficient 19 of the term with the highest degree in B(z) is the value 9F.

Since the value of the coefficient 19 of the term with the highest degree in B(z) is 9F, the syndrome monitoring device 51 outputs 1 as the monitoring signal 17. Since the monitoring signal 17 is 1, the shifting or incrementing is not performed.

Figure 12:
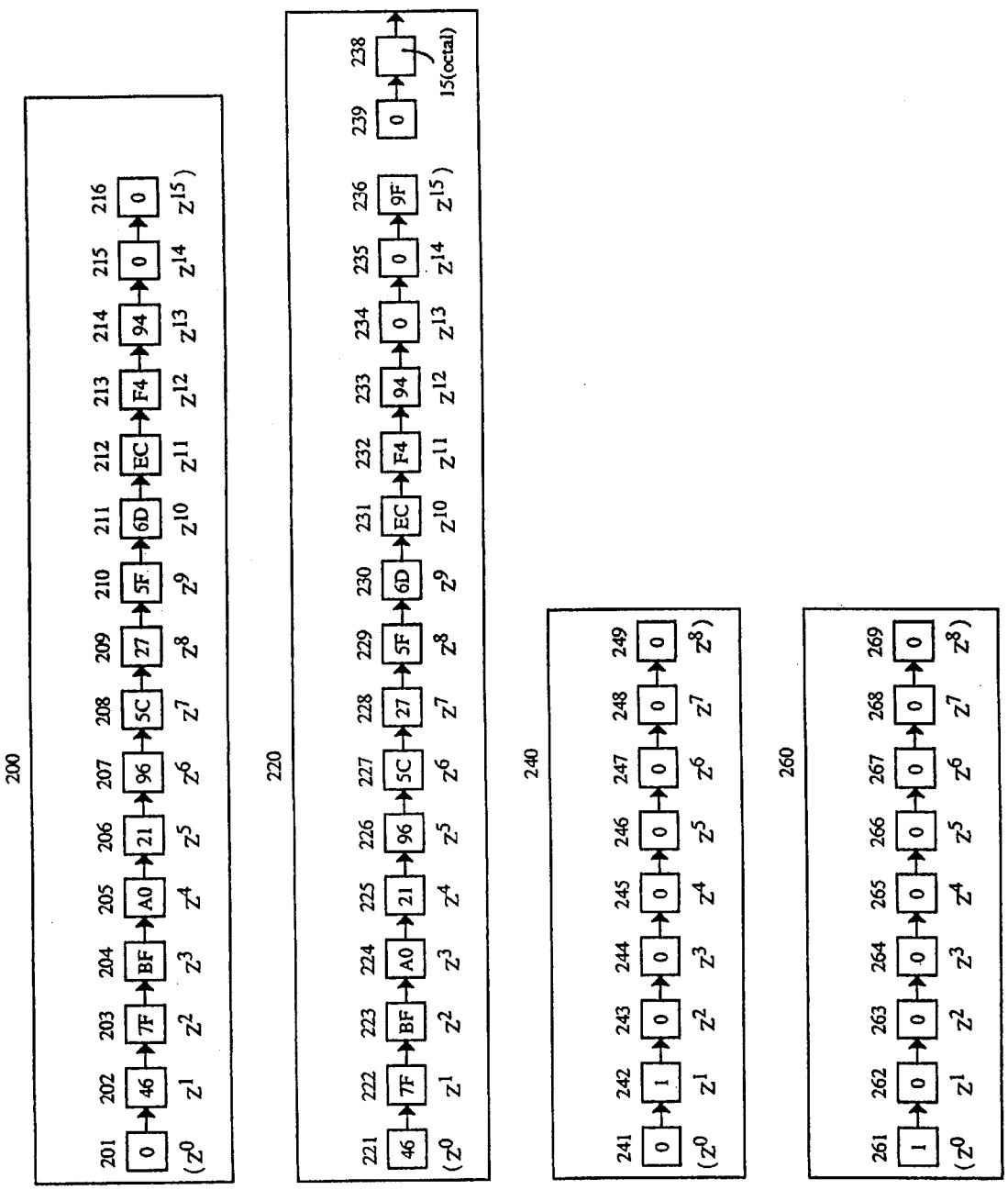
FIG. 12 is a state diagram of the polynomial storage devices in a second operation example of the same Euclid's algorithm apparatus.

The states of the polynomial storage devices 200, 220, 240, 260 at this point are shown in FIG. 12.

The initial setting has thus been finished.

The polynomials A(z), B(z), L(z), M(z) stored in the polynomial storage devices 200, 220, 240, 260 after initial setting in the present example are the polynomials A(z), B(z), L(z), M(z) after the first Galois-field operations in the second example of operations in the Euclid's algorithm of the prior example. As a result, the number of Galois field operations before obtaining the error-locator-polynomial σ(z) is three, that is, one less than in the first example of operations in the Euclid's algorithm of the prior example.

Also, the coefficient 19 of the term with the highest degree in B(z) is the value 9F, which is the coefficient of the term with the highest degree in the polynomial B(z).

Further, the degree 18 of the polynomial B(z) is the value 15 (decimal number), which is the degree of the polynomial B(z).

The coefficient 19 of the term with the highest degree in B(z) and the degree 18 of B(z) can be directly used in the first Galois-field operations, as shown in the flowchart of the general Euclid's algorithm of FIG. 20. Therefore, the number of Galois-field operations in the first Galois-field operations becomes fewer.

A third example of operations in the Euclid's algorithm apparatus in the sixth embodiment of the present invention is described in the following.

This example of operations uses the same syndrome equation as the one in the third example of operations in the Euclid's algorithm described previously. For the coefficients of the syndrome equations S(z), $s_{15}= \ldots =s_n=0$ and $s_{n-1}\neq 0$, where n<15, and n is an integer, in this case.

First, the polynomial storage device 200 inputs the value 0 and the syndrome 0, . . . , 14 respectively to the register 201 and the registers 202 to 216. The polynomial storage device 220 inputs the syndrome 0, . . . , 15 and the value 0 respectively to the registers 221 to 236 and the register 239. The polynomial storage device 240 inputs the values 0, 1, 0 respectively to the registers 241, 242, and 243 to 249. The polynomial storage device 260 inputs the values 1, 0, 0 respectively to the register 261 and the registers 262 to 269. The coefficient 19 of the term with the highest degree in B(z) is the value 0.

Figure 13A:
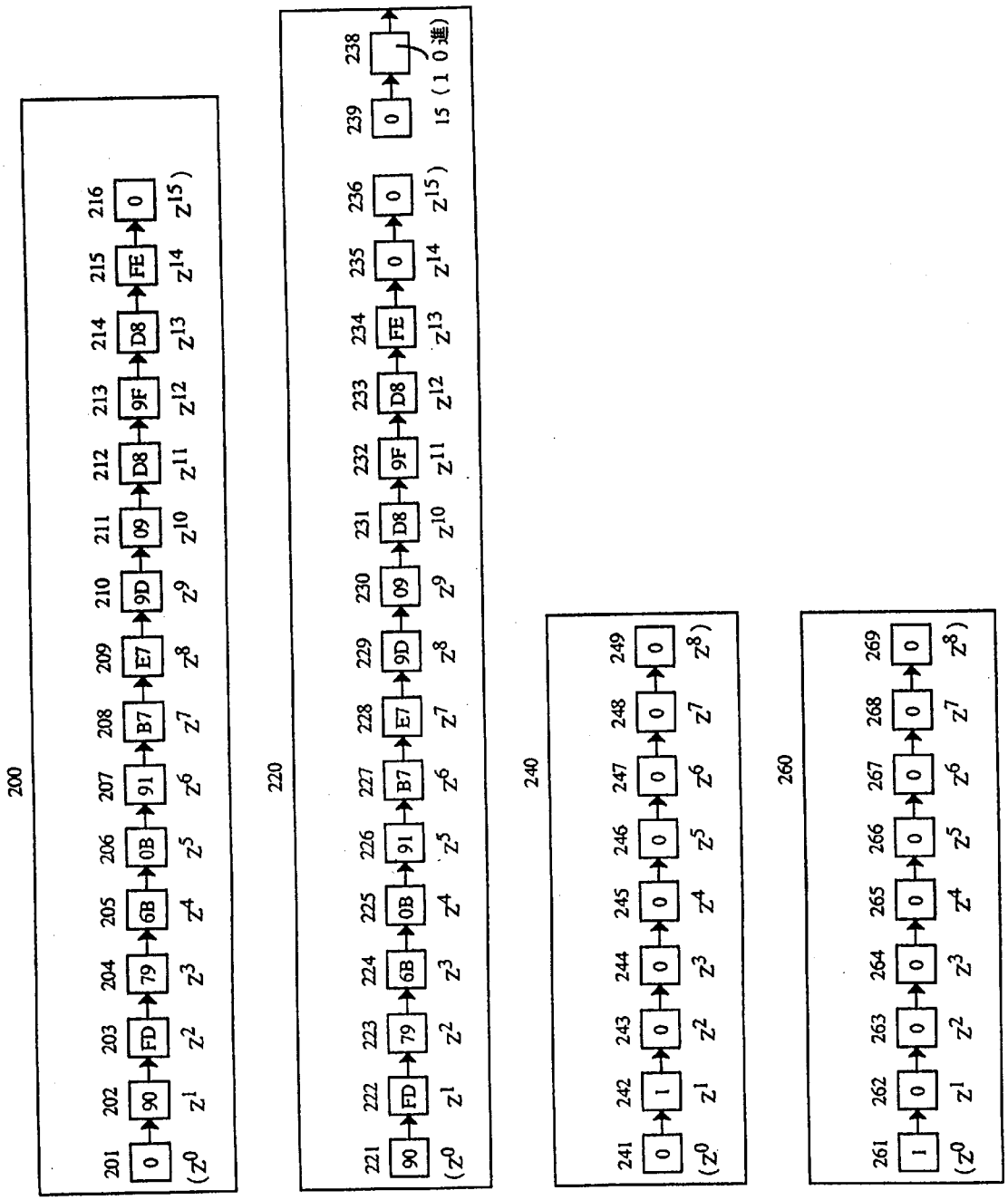
FIGS. 13A and 13B are state diagrams of the polynomial storage devices in a third operation example of the same Euclid's algorithm apparatus.

The states of the polynomial storage devices 200, 220, 240, 260 at this point are shown in FIG. 13A.

Since the value of the coefficient 19 of the term with the highest degree in B(z) is 0, the syndrome monitoring device 51 outputs 0 as the monitoring signal 17.

Since the monitoring signal 17 is 0, the polynomial storage devices 200, 220, 240, 260 respectively shift the data stored in the registers 201 to 216, 221 to 236, 241 to 249, and 261 to 269 to the right (in the direction of increasing indices), until the monitoring signal 17 becomes 1. When the value FE is stored in the register 236, the coefficient 19 of the term with the highest degree in B(z) becomes the value FE, and the syndrome monitoring device 51 outputs 1 as the monitoring signal 17.

Figure 13B:
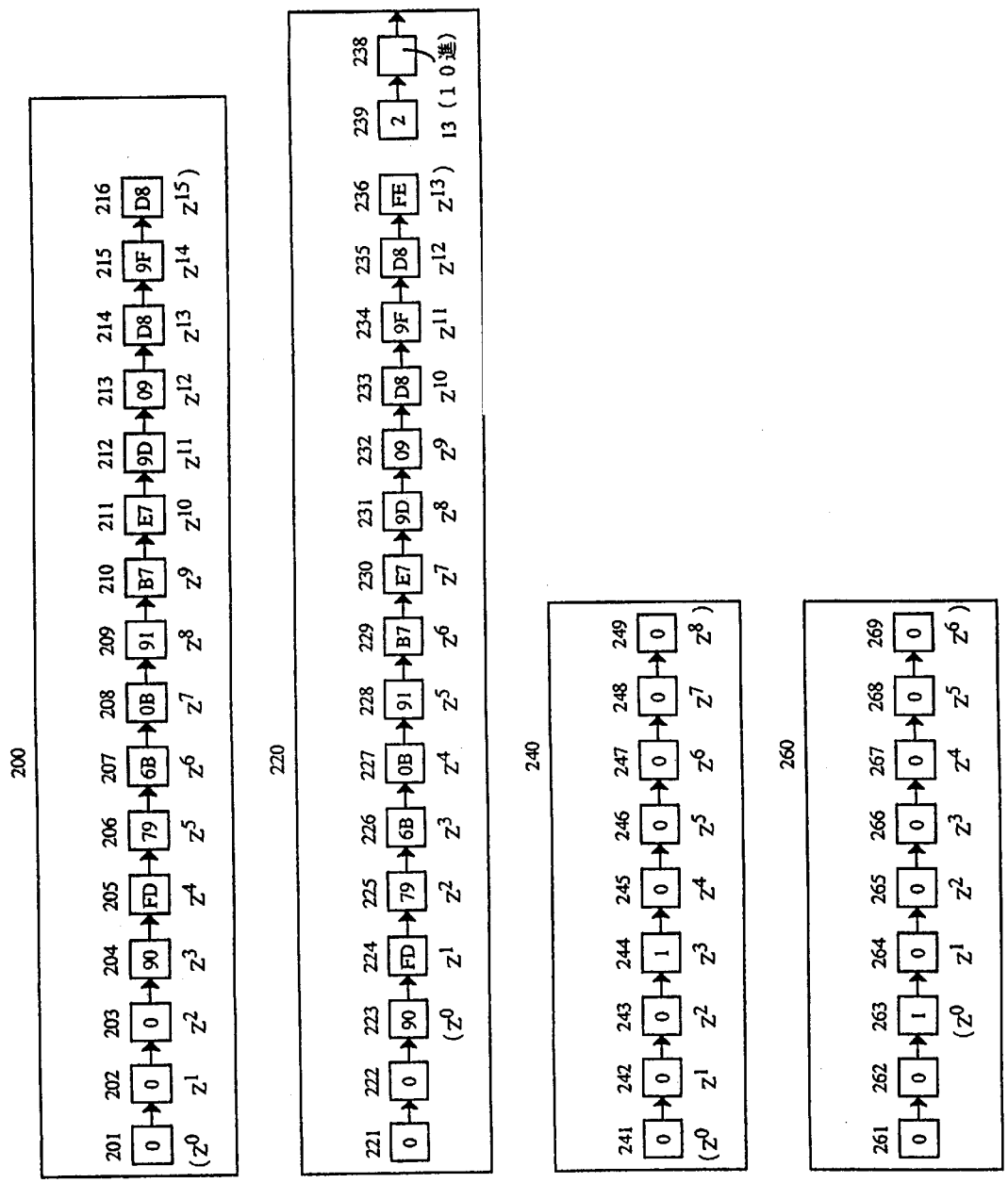

The states of the polynomial storage devices 200, 220, 240, 260 at this point are shown in FIG. 13B.

The initial setting has thus been finished.

The polynomials A(z), B(z), L(z), M(z) stored in the polynomial storage devices 200, 220, 240, 260 after initial setting in the present example of operations are the polynomials A(z), B(z), L(z), M(z) after the first Galois-field operations in the third example of operations in the Euclid's algorithm of the prior example. As a result, the number of Galois field operations before obtaining the error-locator-polynomial σ(z) is three, that is, one less than in the first example of operations in the Euclid's algorithm of the prior example.

Also, the coefficient 19 of the term with the highest degree in B(z) is the value FE, which is the coefficient of the term with the highest degree in the polynomial B(z).

Further, the degree 18 of the polynomial B(z) is the value 13 (decimal number), which is the degree of the polynomial B(z).

The coefficient 19 of the term with the highest degree in B(z) and the degree 18 of B(z) can be directly used in the first Galois-field operations, as shown in the flowchart FIG. 20 of the general Euclid's algorithm after initial setting. Therefore, the number of Galois-field operations in the first Galois-field operations becomes fewer.

In this way, the Euclid's algorithm apparatus in the sixth embodiment of the present embodiment allows the execution of the Euclid's algorithm, regardless of the coefficients of the syndrome equation S(z), reduces the number of Galois-field operations necessary for the execution of the Euclid's algorithm, and also reduces the number of operations in the first Galois-field operations. Therefore, the Euclid's algorithm apparatus can accommodate an increase in the speed of processing.

In the Euclid's algorithm apparatus in the sixth embodiment of the present invention, the register 239 has stored the places of the terms with degree 0 in the polynomial B(z) and M(z), but may store the places of the terms with another degree.

Also, in the polynomial storage device 240, the register 241 has stored the coefficient of the term with degree 0 in the polynomial L(z), but another register may store the coefficient.

Also, in the polynomial storage device 260, the register 239 within the polynomial storage device 220 has stored the place of the term with degree 0 in the polynomial M(z), but another register may be installed and that register may store the place. Also, the place of the term in degree 0 may be fixed.

The Euclid's algorithm apparatus in the sixth embodiment of the present invention is characterized in that, in an Euclid's algorithm apparatus that has as its input the syndrome equation $$S(z)=s_{k-1}z^{k-1}+s_{k-2}z^{k-2}+ \ldots +s_0,$$

where k>0, k is an integer, and $s_{k-1}, \ldots, s_0$ are elements of a Galois field, has polynomial storage devices A, B, L, M and a Galois-field operations device, performs the initial setting of the polynomial storage devices A, B, L, M, depending on the syndrome equation, performs Galois-field operations by using the polynomial storage devices A, B, L, M and the Galois-field operations device, and obtains the error-locator-polynomial, the Euclid's algorithm apparatus, during initial setting, stores the polynomial $$B(z)=s_{k-1}z^{k-1}+s_{k-2}z^{k-2}+ \ldots +s_0$$

in the polynomial storage device B, stores the polynomial $$M(z)=1$$

in the polynomial storage device M, and stores the polynomial $$A(z)=s_{n-2}z^{k-1}+s_{n-3}z^{k-2}+ \ldots +s_0z^{k-n+1},$$

in the polynomial storage device A and stores the polynomial $$L(z)=z^{k-n}+1$$

in the polynomial storage device L, if $s_{k-1}= \ldots =s_n=0$ and $s_{n-1}\neq 0$, where n<k−1, and k is an integer, for the coefficients of the syndrome equation S(z), and stores the polynomial $$A(z)=s_{k-2}z^{k-1}+s_{k-3}z^{k-2}+ \ldots +s_0z,$$

in the polynomial storage device A and stores the polynomial $$L(z)=z$$

in the polynomial storage device L, otherwise. The Euclid's algorithm apparatus allows the execution of the Euclid's algorithm, regardless of the coefficients of the syndrome equation S(z), and reduces the number of Galois-field operations necessary for the execution of the Euclid's algorithm, to accommodate an increase in the speed of processing.

Further, the polynomial storage device A has registers ak−1, . . . , a0, the polynomial storage device B has registers bk−1, . . . , b0 and a register dB, the polynomial storage device L has registers li−1, . . . ,l0, where i>0. and i is an integer, the polynomial storage device M has registers mj−1, . . . , m0, where j>0, and j is an integer, and the Euclid's algorithm apparatus has a syndrome monitoring device that monitors the register bk−1 to output 0 if the data stored in the register bk−1 is 0 and to output 1 if the data stored in the register bk−1 is other than 0, as a monitoring signal, and, during initial setting, the Euclid's algorithm apparatus inputs the coefficients of the syndrome equation S(z) and constant $\{s_{k-2}, s_{k-3}, \ldots, s_0, 0\}$ to the registers ak–1, ..., a0, inputs the coefficients $\{s_{k-1}, s_{k-2}, \ldots, s_0\}$ of the syndrome equation S(z) to the registers bk–1, ..., b0, inputs the constants {1, 0} to the register lv, lv–1, inputs the constant 1 to the register mw, inputs a constant to the register dB, where 0<v<i, 0<w<j, and v, w are integers, and, if the monitoring signal is 0, respectively shifts the data stored in the registers ak–1, ..., a0 and the registers bk–1, ..., b0 in the direction of increasing indices until the monitoring signal becomes 1, and increments or decrements the value stored in the register dB by the number of the shifts. The Euclid's algorithm apparatus reduces the number of Galois-field operations necessary for the execution of the Euclid's algorithm, to accommodate an increase in the speed of processing.

Figure 14:
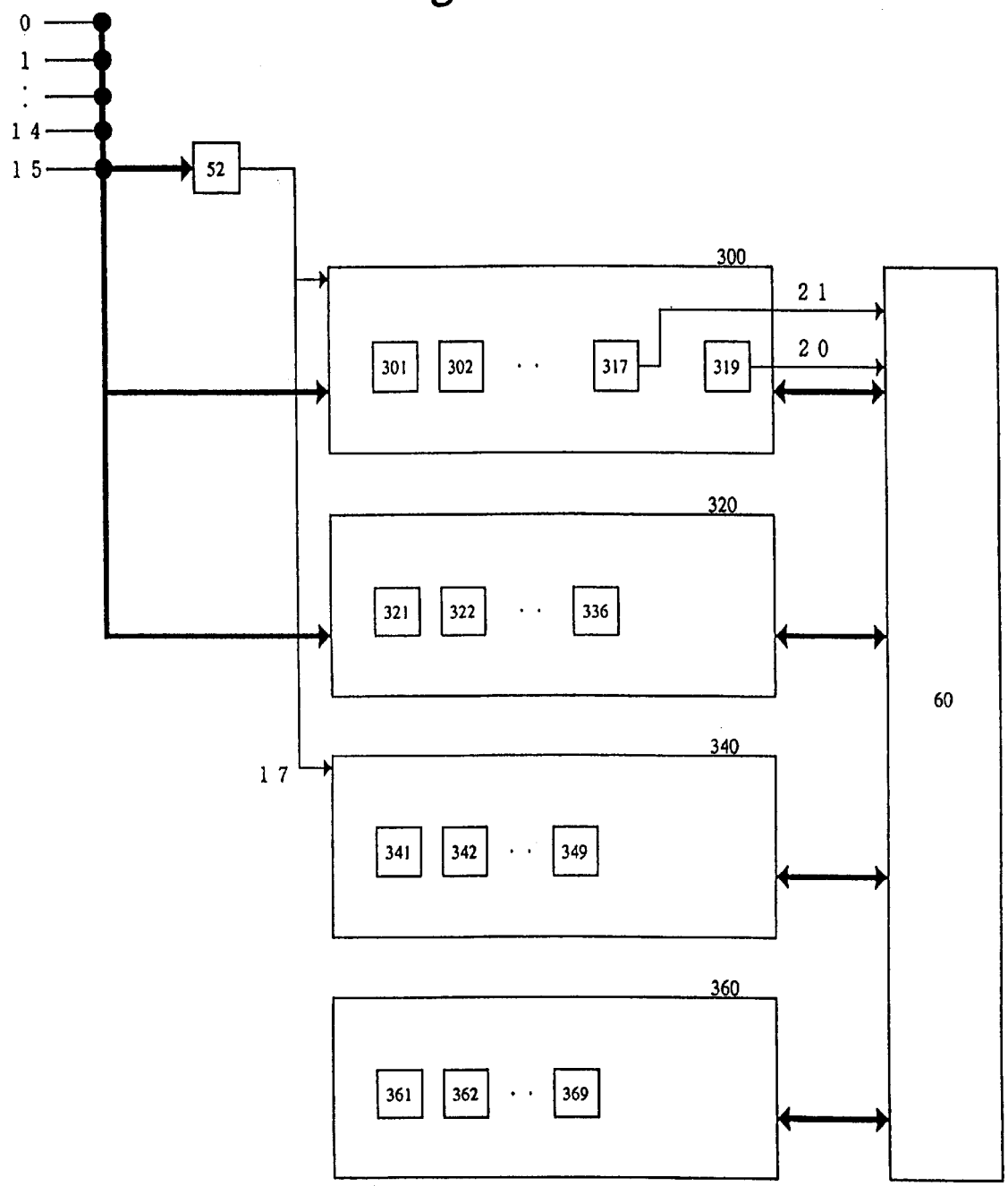
FIG. 14 is a block diagram illustrating the construction of the Euclid's algorithm apparatus in a seventh embodiment of the present invention.
Figure 18:
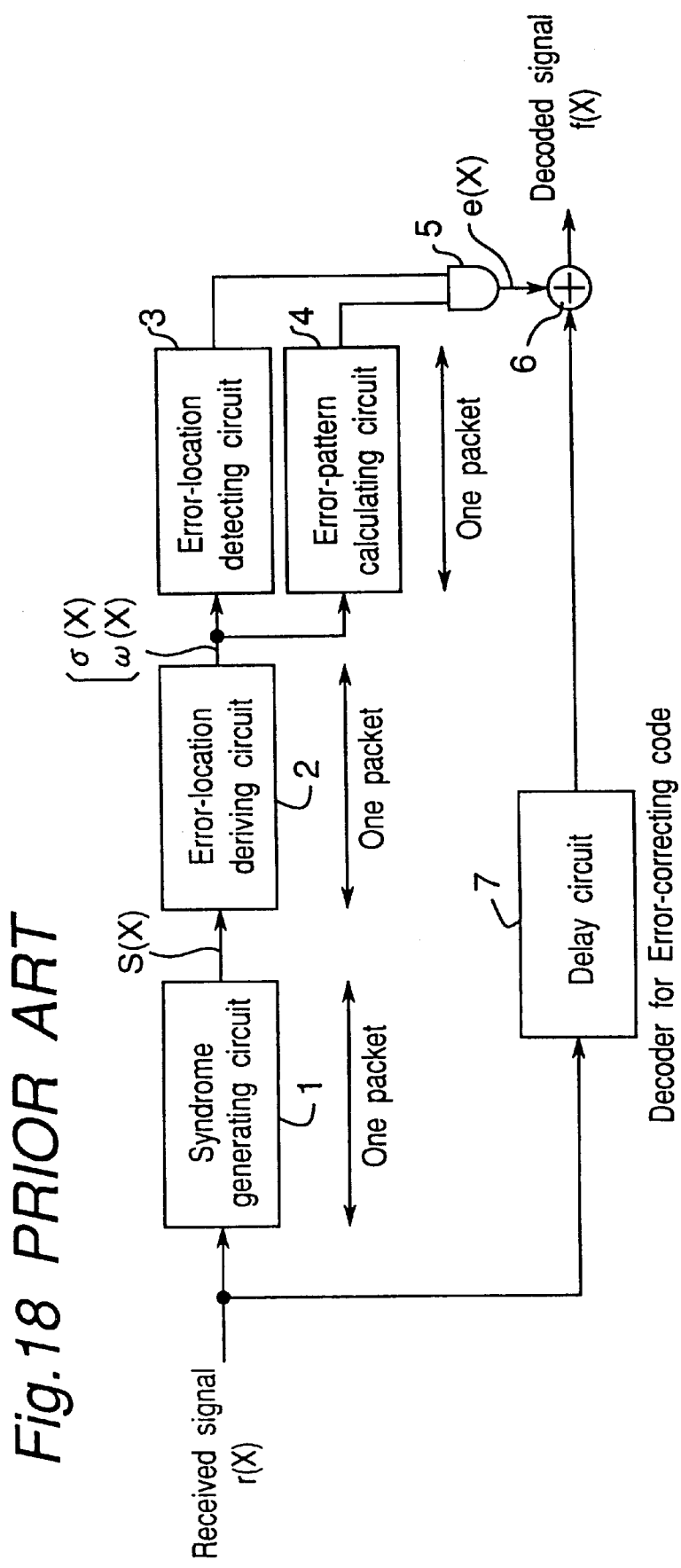
FIG. 18 is a block diagram of a prior Reed-Solomon error-correcting circuit.
Figure 19:
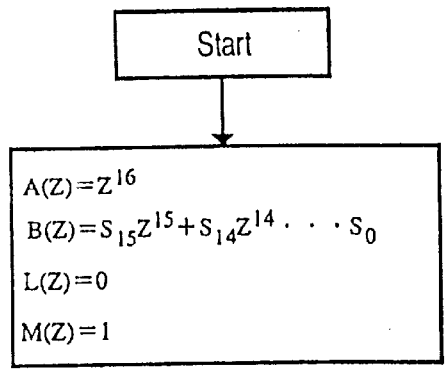
FIG. 19 is a flowchart illustrating the method of initial setting in a prior exemplary Euclid's algorithm.

FIG. 14 is a block diagram illustrating the Euclid's algorithm apparatus in a seventh embodiment of the present invention.

In the Euclid's algorithm apparatus in the seventh embodiment of the present invention, the constructions regarding the syndrome 0, ..., 15, the monitoring signal 17, and the Galois-field operations device 60 are completely the same as the constructions in the Euclid's algorithm apparatus in the fifth embodiment of the present invention, illustrated in FIG. 4, so that their descriptions are omitted from here.

20 is the degree of A(z).

21 is the coefficient of the term with the highest degree in A(z).

52 is a syndrome monitoring device that inputs the syndrome 8, ..., 15 and lets the monitoring signal 17 be 0, if at least one of the syndrome 8 to 15 is the value 0, and lets the syndrome signal 17 be 1, otherwise, to output the monitoring signal 17.

300 is a polynomial storage device that consists of registers 301 to 317 and the register 319, outputs the data stored in the register 317 as the coefficient 21 of the term with the highest degree in the A(z), outputs the data stored in the register 319 as the degree 20 of the A(z), and, during initial setting, inputs the values 0, 1, 16 (decimal number) respectively to the registers 301 to 316, 317, and 319, if the monitoring signal 17 is 0, and inputs the value 0, the value 0, the syndrome 0, ..., 14, the value 15 (decimal number) respectively to the registers 301, 302, 303 to 317, and 319, and, after initial setting, transfers data to and from the Galois-field operations device 60.

320 is a polynomial storage device that consists of registers 321 to 336, inputs the syndrome 0, ..., 15 to the registers 321 to 336 during initial setting, and transfers data to and from the Galois-field operations device 60 after initial setting.

340 is a polynomial storage device that consists of registers 341 to 349, and, during initial setting, inputs the value 0 to the registers 341 to 349 if the monitoring signal 17 is 0, and inputs the values 0, 1, 0 respectively to the registers 341, 342, and 343 to 349 if the monitoring signal 17 is 1, and transfers data to and from the Galois-field operations device 60 after initial setting.

360 is a polynomial storage device that consists of registers 361 to 369, inputs the values 1, 0 respectively to the registers 361 and 362 to 369 during initial setting, and transfers data to and from the Galois-field operations device 60 after initial setting.

The operation of the Euclid's algorithm apparatus in the seventh embodiment of the present invention constructed in this way is described in the following.

The Euclid's algorithm apparatus in the seventh embodiment of the present invention inputs the syndrome equation $$S(z)=s_{15}z^{15}+s_{14}Z^{14}+ \ldots +s_0,$$

where $s_{15}, \ldots, s_0$ are elements of the Galois field GF($2^8$).

During initial setting, the Euclid's algorithm apparatus stores the polynomials $$B(z)=s_{15}z^{15}+s_{14}Z^{14}+ \ldots +s_0,$$

$$M(z)=1$$

respectively in the polynomial storage devices 320 and 360.

If at least one of the coefficients $s_{15}, \ldots, s_8$ of the syndrome equation S(z) is 0, then the Euclid's algorithm apparatus stores the polynomials $$A(z)=z^{16},$$

$$L(z)=0$$

respectively in the polynomial storage devices 300, 340. Otherwise, the Euclid's algorithm apparatus stores the polynomials $$A(z)=s_{14}z^{15}+s_{13}Z^{14}+ \ldots +s_0z,$$

$$L(z)=z.$$

respectively in the polynomial storage devices 300, 340.

The polynomial storage devices 320, 340, 360 store the polynomials B(z), L(z), M(z) by storing their coefficients. The registers 321, 341, and 361 are respectively the places of the terms of the degree 0 in the polynomials B(z), L(z), and M(z).

The polynomial storage device 300 stores the polynomial A(z) by storing the coefficients of the polynomial A(z) in the registers 301 to 317 and by storing the degree of the coefficient stored in the register 317 in the register 319. If the values stored in the register 319 are 15 and 16 (decimal numbers), then the degrees of the coefficients stored in the register 317 are respectively 15 and 16.

After the initial setting, data is transferred between the polynomial storage devices 300, 320, 340, 360 and the Galois-field operations device 60. which performs Galois-field operations a plurality of times.

As a result, an error-locator-polynomial σ(z) is stored in the polynomial storage device 340 or 360.

The Euclid's algorithm apparatus in the seventh embodiment of the present invention is characterized by its method of initial setting, so that the operation during initial setting is detailed in the following in conjunction with examples of operations.

A first example of operations in the Euclid's algorithm apparatus in the seventh embodiment of the present invention is described in the following. This example of operations uses the same syndrome equation as the one in the first example of operations in the prior Euclid's algorithm described previously. For the coefficients of the syndrome equation S(z), $s_{15}, \ldots, s_8 \neq 0$ in this case.

Since the values of the syndrome 8, ..., 15 are all non-zero, the syndrome monitoring device 52 outputs 1 as the monitoring signal 17.

The polynomial storage device 320 inputs the syndrome 0, ..., 15 respectively to the registers 321 to 336. The polynomial storage device 360 inputs the values 1, 0 respectively to the register 361 and the registers 362 to 369.

Since the monitoring signal 17 is 1, the polynomial storage device 300 inputs the value 0, the value 0, the syndrome 0, ..., 14, and the value 15 (decimal number) respectively to the registers 301, 302, 303 to 317, and 319. The polynomial storage device 340 inputs the values 0, 1, 0 respectively to the registers 341, 342, and 343 to 349.

Figure 15:
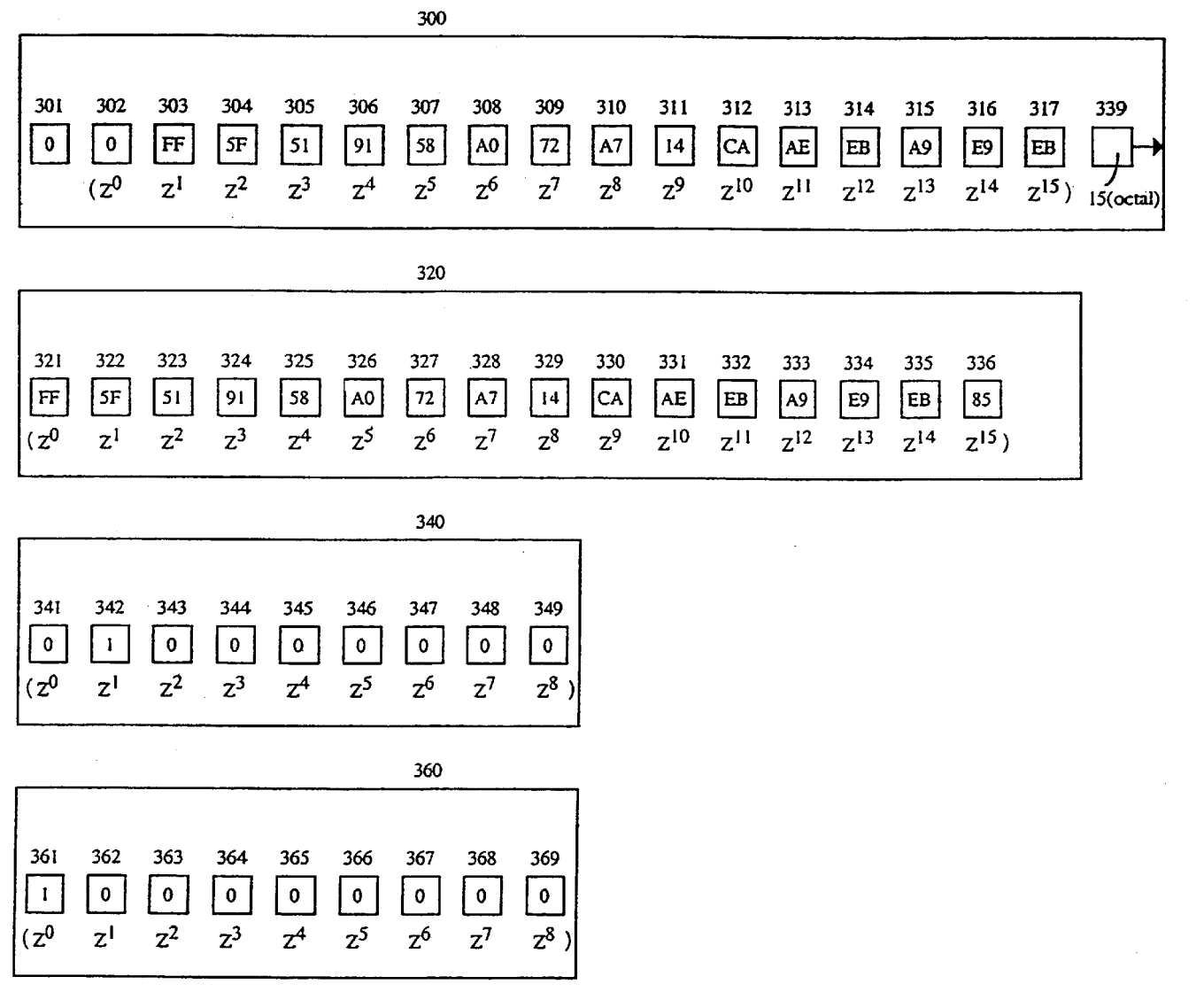

The states of the polynomial storage devices 300, 320, 340, 360 at this point are shown in FIG. 15.

The initial setting has thus been finished.

The polynomials A(z), B(z), L(z), M(z) stored in the polynomial storage devices 300, 320, 340, 360 after initial setting in the present example are the polynomials A(z), B(z), L(z), M(z) after the first Galois-field operations in the first example of operations in the Euclid's algorithm of the prior example. As a result, the number of Galois field operations before obtaining the error-locator-polynomial σ(z) is five, that is, one less than in the first example of operations in the Euclid's algorithm of the prior example.

Also, the coefficient 20 of the term with the highest degree in A(z) is the value EB, which is the coefficient of the term with the highest degree in the polynomial A(z).

Further, the degree 18 of the polynomial B(z) is the value 15 (decimal number), which is the degree of the polynomial B(z).

The coefficient 19 of the term with the highest degree in B(z) and the degree 18 of B(z) can be directly used in the first Galois-field operations, as shown in the flowchart of the general Euclid's algorithm of FIG. 20. Therefore, the number of Galois-field operations in the first Galois-field operations becomes fewer.

A second example of operations in the Euclid's algorithm apparatus in the seventh embodiment of the present invention is described in the following.

This example of operations uses the same syndrome equation as the one in the second example of operations in the prior Euclid's algorithm described previously. For the coefficients of the syndrome equation S(z), $s_{15} \neq 0$, and at least one of $s_{14}, \ldots, s_8$ is 0 in this case.

Since the values of the syndrome 13, 14 are 0, the syndrome monitoring device 52 outputs 0 as the monitoring signal 17.

The polynomial storage device 320 inputs the syndrome 0, . . . , 15 respectively to the registers 321 to 336. The polynomial storage device 360 inputs the values 1, 0 respectively to the registers 361, and 362 to 369.

Since the monitoring signal 17 is 0, the polynomial storage device 300 inputs the values 0, 1, 16 (decimal number) respectively to the registers 301 to 316, 317, and 319. The polynomial storage device 340 inputs the value 0 to the registers 341 to 349.

Figure 16:
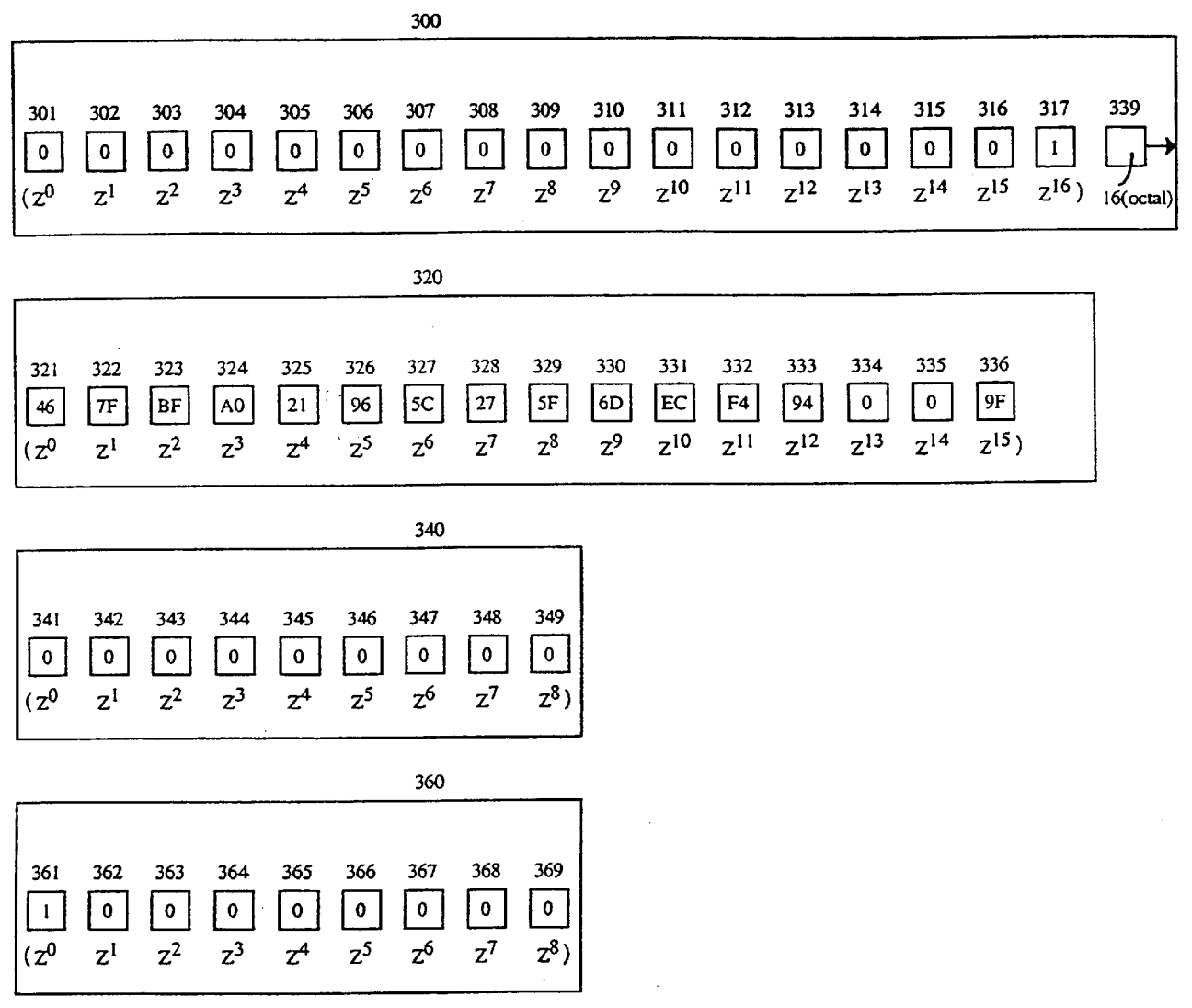

The states of the polynomial storage devices 300, 320, 340, 360 at this point are shown in FIG. 16.

The initial setting has thus been finished.

The polynomials A(z), B(z), L(z), M(z) stored in the polynomial storage devices 300, 320, 340, 360 after initial setting in the present example are the polynomial A(z), B(z), L(z), M(z) after the first Galois-field operations in the second example of operations in the Euclid's algorithm of the prior example. As a result, the number of Galois field operations before obtaining the error-locator-polynomial σ(z) is four, that is, the same as in the second example of operations in the Euclid's algorithm of the prior example.

Also, the coefficient 20 of the term with the highest degree in A(z) is the value 1, which is the coefficient of the term with the highest degree in the polynomial A(z).

Further, the degree 18 of the polynomial B(z) is the valuer 16 (decimal number), which is the degree of the polynomial B(z).

The coefficient 19 of the term with the highest degree in B(z) and the degree 18 of the polynomial B(z) can be directly used in the first Galois-field operations, as shown in the flowchart of the general Euclid's algorithm of FIG. 16. Therefore, the number of Galois-field operations in the first Galois-field operations becomes fewer.

A third example of operations in the Euclid's algorithm apparatus in the seventh embodiment of the present invention is described in the following.

This example of operations uses the same syndrome equation as the one in the third example of operations in the prior Euclid's algorithm described previously. For the coefficient of the syndrome equations S(z), $s_{15} = \ldots = s_n = 0$ and $s_{n-1} \neq 0$, where n<15, and n is an integer, in this case.

Since the values of the syndrome 14, 15 are 0, the syndrome monitoring device 52 outputs 0 as the monitoring signal 17.

The polynomial storage device 320 inputs the syndrome 0, . . . , 15 to the registers 321 to 336. The polynomial storage device 360 inputs the values 1, 0 respectively to the registers 361 and 362 to 369.

Since the monitoring signal 17 is 0, the polynomial storage device 300 inputs the values 0, 1, 16 (decimal number) respectively to the registers 301 to 316, 317, and 319, and the polynomial storage device 340 inputs the value 0 to the registers 341 to 349.

The states of the polynomial storage devices 300, 320, 340, 360 at this point are shown in FIG. 17.

The initial setting has thus been finished.

The polynomials A(z), B(z), L(z), M(z) stored in the polynomial storage devices 300, 320, 340, 360 after initial setting in the present example are the polynomials A(z), B(z), L(z), M(z) after the first Galois-field operations in the third example of operations in the Euclid's algorithm of the prior example. As a result, the number of Galois field operations before obtaining the error-locator-polynomial σ(z) is four, that is, the same as in the third example of operations in the Euclid's algorithm of the prior example.

Also, the coefficient 20 of the term with the highest degree in A(z) is the value 1, which is the coefficient of the term with the highest degree in the polynomial A(z).

Further, the degree 18 of the polynomial B(z) is the value 16 (decimal number), which is the degree of the polynomial B(z).

The coefficient 19 of the term with the highest degree in B(z) and the degree 18 of B(z) can be directly used in the first Galois-field operations, as shown in the flowchart FIG. 20 of the general Euclid's algorithm after initial setting. Therefore, the number of Galois-field operations in the first Galois-field operations becomes fewer.

In this way, the Euclid's algorithm apparatus in the seventh embodiment of the present embodiment has a case where the number of Galois-field operations is the same and a case where the number of Galois-field operations is reduced.

However, the case where the number of Galois-field operations is the same as in the prior example is only the special case where at least one of the coefficients $s_{15}, \ldots, s_8$ of the syndrome equation S(z) is 0 as in the above second and third examples of operations. In the other cases, that is, in the case where $s_{15}, \ldots, s_8 \neq 0$, the number of Galois-field operations is reduced, as shown in the above first example of operations.

As described above, the Euclid's algorithm apparatus in the seventh embodiment of the present invention allows the execution of the Euclid's algorithm, regardless of the coefficients of the syndrome equation S(z), reduces the number of Galois-field operations necessary for the execution of the Euclid's algorithm, depending on the coefficients of the syndrome equation S(z), and also reduces the number of operations in the first Galois-field operations, regardless of the coefficients of the syndrome equation S(z). Therefore, the Euclid's algorithm apparatus can accommodate an increase in the speed of processing.

In the Euclid's algorithm apparatus in the seventh embodiment of the present invention, the register 319 has stored the degree of the coefficient stored in the register 317, but may store the degree of the data stored in another register. Also, the register 319 may store the place of the term with some degree.

Also, in the polynomial storage devices 340 and 341, the registers 301 and 341 have respectively stored the coefficients of the terms with degree 0 of polynomials, but some other registers may store these coefficients.

Also, in the polynomial storage device 300, the register 301 or 302 has stored the coefficient of the term with degree 0 in the polynomial A (z), so that the data stored in the register 317 has been the coefficient 21 of the term with the highest degree in A(z) However, the register that stores the coefficient of the term with degree 0 in the polynomial A(z) may be fixed to the register 301, so that the data stored in the register 317 or 316 may be the coefficient 21 of the term with the highest degree in A(z).

Also, the Euclid's algorithm apparatus in the seventh embodiment in the present invention has stored, during initial setting, the polynomials $$A(z)=z^k,$$

$$L(z)=1,$$

as the initial setting of the polynomial storage devices A, L, if $s_{k-1} = \ldots = s_{k/2}=0$ and has stored the polynomials $$A(z)=s_{k-2}z^{k-1}+s_{k-3}z^{k-2}+\ldots+s_0z,$$

$$L(z)=z,$$

otherwise. By these means, the Euclid's algorithm apparatus has allowed the execution of the Euclid's algorithm, regardless of the coefficients of the syndrome equation S(z), has reduced the number of Galois-field operations necessary for the execution of the Euclid's algorithm, under the condition $s_{k-1}, \ldots, s_{k/2} \neq 0$ for the coefficients of the syndrome equation S(z), and has reduced the number of Galois-field operations in the first Galois-field operations, regardless of the coefficients of the syndrome equation S(z). However, the condition on the coefficients of the syndrome equation S(z) may be different from the above. For example, if the polynomials $$A(z)=z^k,$$

$$L(z)=1,$$

are stored if $s_{k-1}=0$, and the polynomials $$A(z)=s_{k-2}z^{k-1}+s_{k-3}z^{k-2}+\ldots+s_0z,$$

$$L(z)=z,$$

are stored otherwise, then the execution of the Euclid's algorithm is possible, regardless of the coefficients of the syndrome equation S(z), and the number of Galois-field operations necessary for the execution can be reduced under the condition that $s_{k-1} \neq 0$ for coefficients of the syndrome equation S(z).

Also, if the polynomials $$A(z)=z^k,$$

$$L(z)=1,$$

are stored if at least one of the coefficients $s_{k-1}, \ldots, s_0$ of the syndrome equation S(z) is 0, and the polynomials $$A(z)=s_{k-2}z^{k-1}+s_{k-3}z^{-2}+\ldots+s_0z,$$

$$L(z)=z,$$

are stored otherwise, then the execution of the Euclid's algorithm is possible, regardless of the coefficients of the syndrome equation S(z), the number of Galois-field operations necessary for the execution can be reduced, under the condition $s_{k-1}, \ldots, s_0 \neq 0$ for coefficients of the syndrome equation S(z), and the number of operations in the first Galois-field operations can be reduced, regardless of the coefficients of the syndrome equation S(z).

The Euclid's algorithm apparatus in the seventh embodiment of the present invention is characterized in that, in an Euclid's algorithm apparatus that has as its input the syndrome equation $$S(z)=s_{k-1}z^{k-1}+s_{k-2}z^{k-2}+\ldots+s_0,$$

where k>0, k is an integer, and $s_{k-1}, \ldots, s_0$ are elements of a Galois field, has polynomial storage devices A, B, L, M and a Galois-field operations device, performs the initial setting of the polynomial storage devices A, B, L, M, depending on the syndrome equation, performs Galois-field operations by using the polynomial storage devices A, B, L, M and the Galois-field operations device, and obtains the error-locator-polynomial, the Euclid's algorithm apparatus, during initial setting, stores the polynomial $$B(z)=s_{k-1}z^{k-1}+s_{k-2}z^{k-2}+\ldots+s_0$$

in the polynomial storage device B, stores the polynomial $$M(z)=1$$

in the polynomial storage device M, and, depending on the coefficients of the syndrome equation S(z), stores the polynomial $$A(z)=k_{k-2}z^{k-1}+s_{k-3}z^{k-2}+\ldots+s_0z$$

in the polynomial storage device A and stores the polynomial $$L(z)=z$$

in the polynomial storage device L. The Euclid's algorithm apparatus is further characterized in that it stores $$A(z)=z^k,$$

$$L(z)=1,$$

respectively in the polynomial storage devices A and L, if $s_{k-1}=0$ for the coefficients of the syndrome equation S(z). By these means, the Euclid's algorithm apparatus allows the execution of the Euclid's algorithm, regardless of the coefficient of the syndrome equation S(z), and reduces the number of Galois-field operations necessary for the execution of the Euclid's algorithm, depending on the coefficients of the syndrome equation S(z), to accommodate the speedup of processing.

Further, the polynomial storage device A has registers ak−1, . . . , a0, the polynomial storage device B has registers bk−1, . . . , b0, the polynomial storage device L has registers li−1, . . . , 10, where i>0. i is an integer, the polynomial storage device M has registers mj−1, . . . , m0, where j>0, and j is an integer, and the Euclid's algorithm apparatus has a syndrome monitoring device that monitors the coefficients of the syndrome equation S(z), to output 0 or 1, depending on the coefficients of the syndrome equation S(z), as a monitoring signal, and, during initial setting, the Euclid's algorithm apparatus inputs the coefficients of the syndrome equation S(z), $\{s_{k-2}, \ldots, s_0\}$ to the registers bk−1, . . . , b0, inputs the constant 1 to the register mw, where 0<w<j, and w is an integer, inputs the constants {1, . . . , 0, 0} and constant 0 respectively to the registers ak−1, . . . , a0 and the register lv if the monitoring signal is 0, where 0<v<i, and v is an integer, inputs the coefficients of the syndrome equation S(z) and the constant $\{s_{k-2}, s_{k-3}, \ldots, s_0, 0\}$ to the registers ap, . . . , ap-k+1 if the monitoring signal is 1, where p=k or k−1, and inputs the constants {0, 1} to the registers lq, lq−1, where 0<q<i, and q is an integer. The Euclid's algorithm apparatus is further characterized in that the polynomial storage device A has a register dA, the syndrome monitoring device lets the monitoring signal be 0, if at least one of the coefficients $s_{k-1}, \ldots, s_{k/2}$ of the syndrome equation S(z) is 0, lets the monitoring signal be 1 otherwise, and, during initial setting, inputs a constant e, where e is an integer, to the register dA if the monitoring signal is 0, inputs a constant f, where f≠e, and f is an integer, to the register dA if the monitoring signal is 1. By these means, the Euclid's algorithm apparatus reduces the number of operations in the first Galois-field operations, to accommodate an increase in the speed of processing.

In the second to seventh embodiments of the present invention, the descriptions have been made with the Reed-Solomon error-correcting methods based on a report of the Committee on Digital Broadcasting Systems in the Council of Electronic Communication. However, the present invention is not limited to the methods and concerned with the method and apparatus of the Euclid's algorithm used in error-correcting methods such as the BHC error-correcting method, the Reed-Solomon error-correcting method. The present invention is a method such that in the Euclid's algorithm that obtains an error-locator-polynomial by performing initial setting for the polynomials A(z), B(z), L(z), and M(z), based on the syndrome equation $$S(z)=s_{k-1}z^{k-1}+s_{k-2}z^{k-2}+ \ldots +s_0,$$

where k>0, k is an integer, and $s_{k-1}, \ldots, s_0$ are elements of a Galois field, and by performing Galois-field operations, the method of the initial setting sets the above polynomials as $$B(z)=s_{k-1}z^{k-1}+s_{k-2}z^{k-2}+ \ldots +s_0,$$

$$M(z)=1,$$

and, depending on the coefficients of the syndrome equation S(z), as $$A(z)=s_{k-2}z^{k-1}+s_{k-3}z^{k-2}+ \ldots +s_0 z,$$

$$L(z)=z.$$

alternatively, the present invention is an Euclid's algorithm apparatus characterized in that in an Euclid's algorithm apparatus that has as its input the syndrome equation $$S(z)=s_{k-1}z^{k-1}+s_{k-2}z^{k-2}+ \ldots +s_0,$$

where k>0, k is an integer, and $s_{k-1}, \ldots, s_0$ are elements of a Galois field, has polynomial storage devices A, B, L, M and a Galois-field operations device, performs the initial setting of the polynomial storage devices A, B, L, M, depending on the syndrome equation, performs Galois-field operations by using the polynomial storage devices A, B, L, M and the Galois-field operations device, and obtains the error-locator-polynomial, the Euclid's algorithm apparatus, during initial setting, stores the polynomial $$B(z)=s_{k-1}z^{k-1}+s_{k-2}z^{-2}+ \ldots +s_0$$

in the polynomial storage device B, stores the polynomial $$M(z)=1$$

in the polynomial storage device M, and, depending on the coefficients of the syndrome equation S(z), stores the polynomial $$A(z)=s_{k-2}z^{k-1}+s_{k-3}z^{k-2}+ \ldots +s_0 z$$

in the polynomial storage device A and stores the polynomial $$L(z)=z$$

in the polynomial storage device L. By these means, the present invention obtains similar effects as in the present embodiments.

What is claimed is:

1. A Reed-Solomon error-correcting circuit that receives a transmitted packet encoded with a Reed-Solomon code, decodes a received packet with a Reed-Solomon code, and outputs the decoded packet, said Reed-Solomon error-correcting circuit comprising:

a memory operable to input and delay the received packet to output a delayed packet;

a syndrome generating circuit operable to input the received packet to output a syndrome; and an error-correcting circuit operable to input the delayed packet and the syndrome to output the decoded packet;

said error-correcting circuit comprising:

an error-locator-polynomial/error-evaluator-polynomial calculating circuit operable to input the syndrome and output an error-locator-polynomial and an error-evaluator-polynomial; and a correcting circuit operable to input the delayed packet, the error-locator-polynomial, and the error-evaluator-polynomial, obtain errors contained in the delayed packet from the error-locator polynomial and the error-evaluator-polynomial, remove errors from the delayed packet, and output the decoded packet;

said error-locator-polynomial/error-evaluator-polynomial calculating circuit having a plurality of shift registers and a Galois-field operations circuit to which a final stage output of each shift register is input;

said syndrome generating circuit and said error-correcting circuit operable to perform parallel operation by pipelined processing for each packet; and said error-correcting circuit operable to operate in synchronization with a clock with a period of 1/N the period of the received symbol clock, where N≧1, and N is an integer.

2. In a method of performing Euclid's algorithm that obtains an error-locator-polynomial by performing initial setting for polynomials A(z), B(z), L(z) and M(z), based on the syndrome equation $$S(z)=s_{k-1}z^{k-1}+s_{k-2}z^{k-2}+ \ldots +s_0$$

where k>0, K is an integer and $s_{k-1}$–$s_0$ are elements of a Galois-field, and by performing Galois-field operations in which a method of initial setting sets the polynomials as $$B(z)=s_{k-1}z^{k-1}+s_{k-2}z^{k-2}+ \ldots +s_0$$

$$M(z)=1$$

and, if coefficients of the syndrome equation S(z) $s_{k-1}$–$s_n$≠0 (wherein n<k−1; n is an integer);

$$A(z)=s_{k-2}z^{k-1}+s_{k-3}z^{k-2}+ \ldots +s_0 z,$$

$$L(z)=Z$$

and, if coefficients of the syndrome equation S(z) $s_{k-1}$–$s_n$=0 and $s_{n-1}$≠0 (wherein n<k−1; n is an integer) sets as $$A(z)=s_{n-2}z^{k-1}+s_{n-3}z^{k-2}+ \ldots +s_0 z^{k-n+1}$$

$$L(z)=z^{k-n+1}.$$

3. In a method of performing Euclid's algorithm that obtains an error-locator-polynomial by performing initial setting for polynomials A(z), B(z), L(z), and M(z), based on the syndrome equation $$S(z)=s_{k-1}z^{k-1}+s_{k-2}z^{k-2}+\ldots+s_0,$$

where k>0, k is an integer, and $s_{k-1}$–$s_0$ are elements of a Galois-field, and by performing Galois-field operations, in which a method of initial setting sets the polynomials as $$B(z)=s_{k-1}z^{k-1}+s_{k-2}z^{k-2}+\ldots+s_0,$$

$$M(z)=1;$$

and, if the coefficient of the syndrome equation S(z) $s_{k-1} \neq 0$, $$A(z)=s_{k-2}z^{k-1}+s_{k-3}z^{k-2}+\ldots+s_0 z$$

$$L(z)=z$$

and, if the coefficient of the syndrome equation S(z) $s_{k-1}=0$, sets as $$A(z)=z^k$$

$$L(z)=1.$$

4. In a method of performing Euclid's algorithm that obtains an error-locator-polynomial by performing initial setting for polynomials A(z), B(z), L(z), and M(z), based on the syndrome equation $$S(z)=s_{k-1}z^{k-1}+s_{k-2}z^{k-2}+\ldots+s_0,$$

where k>0, k is an integer, and $s_{k-1}$–$s_0$ are elements of a Galois-field, and by performing Galois-field operations, in which a method of initial setting sets the polynomials as $$B(z)=s_{k-1}z^{k-1}+s_{k-2}z^{k-2}+\ldots+s_0,$$

$$M(z)=1,$$

and, if the coefficient of the syndrome equation S(z) $s_{k-1}$–$s_{k/2} \neq 0$, $$A(z)=s_{k-2}z^{k-1}+s_{k-3}z^{k-2}+\ldots+s_0 z$$

$$L(z)=z$$

and, if either one of the coefficients of the syndrome $s_{k-1}$–$s_{k/2}$ is 0, then sets as $$A(z)=z^k$$

$$L(z)=1.$$

5. An Euclid's algorithm apparatus that has as its input the syndrome equation $$S(z)=s_{k-1}z^{k-1}+s_{k-2}z^{k-2}+\ldots+s_0,$$

where k>0, k is an integer, and $s_{k-1}, \ldots, s_0$ are elements of a Galois field, has polynomial storage devices A, B, L, M and a Galois-field operations device, performs the initial setting of said polynomial storage devices A, B, L, M, depending on the syndrome equation, performs Galois-field operations by using said polynomial storage devices A, B, L, M and said Galois-field operations device, and obtains an error-locator-polynomial;

said Euclid's algorithm apparatus, during initial setting, storing the polynomial $$B(z)=s_{k-1}z^{k-1}+s_{k-2}z^{k-2}+\ldots+s_0$$

in said polynomial storage device B, storing the polynomial $$M(z)=1$$

in said polynomial storage device M, and, if the coefficients of the syndrome equation S(z) $s_{k-1}$–$s_n \neq 0$ (wherein n<k–1; n is an integer), storing the polynomial $$A(z)=s_{k-2}z^{k-1}+s_{k-3}z^{k-2}+\ldots+s_0 z$$

in said polynomial storage device A and storing the polynomial $$L(z)=z$$

in said polynomial storage device L;

and if $s_{k-1}$–$s_n=0$ and $s_{n-1} \neq 0$ for the coefficients of said syndrome equation S(z), where n≤k–1, and n is an integer, said Euclid's algorithm apparatus stores the polynomial $$A(z)=s_{n-2}z^{k-1}+s_{n-3}z^{k-2}+\ldots+s_0 z^{k-n+1}$$

in said polynomial storage device A and stores the polynomial $$L(z)=z^{k-n+1}$$

in said polynomial storage device L.

6. n Euclid's algorithm apparatus that has as its input the syndrome equation $$S(Z)=s_{k-1}z^{k-1}+s_{k-2}z^{k-2}+\ldots+s_0,$$

where k>0, k is an integer, and $s_{k-1}, \ldots, s_0$ are elements of a Galois field, has polynomial storage devices A, B, L, M and a Galois-field operations device, performs the initial setting of said polynomial storage devices A, B, L, M, depending on the syndrome equation, performs Galois-field operations by using said polynomial storage devices A, B, L, M and said Galois-field operations device, and obtains an error-locator-polynomial;

said Euclid's algorithm apparatus, during initial setting, storing the polynomial $$B(z)=s_{k-1}z^{k-1}+s_{k-2}z^{k-2}+\ldots+s_0$$

in said polynomial storage device B, storing the polynomial $$M(z)=1$$

in said polynomial storage device M, and, if the coefficients of the syndrome equation S(z) $s_{k-1} \neq 0$, storing the polynomia $$A(z)=s_{k-2}z^{k-1}+s_{k-3}z^{k-2}+\ldots+s_0 z$$

in said polynomial storage device A and storing the polynomial $$L(z)=z$$

in said polynomial storage device L;

and if $s^{k-1}=0$ for the coefficients of the syndrome equation S(z), said Euclid's algorithm apparatus stores the polynomial $$A(z)=z^k$$

in said polynomial storage device A and stores the polynomial $$L(z)=1$$

in said polynomial storage device L.

7. The Euclid's algorithm apparatus defined in claim 6, wherein:

said polynomial storage device A has registers ak−1, . . . , a0;

said polynomial storage device B has registers $b_{k-1}$, . . . , b0 and a register dB;

said polynomial storage device L has registers li−1, . . . , l0, where i>0, and i is an integer;

said polynomial storage device M has registers mj−1, . . . , m0, where j>0, and j is an integer;

said Euclid's algorithm apparatus has a syndrome monitoring device that monitors said register bk−1 to output 0 if the data stored in said register bk−1 is 0 and to output 1 if the data stored in said register bk−1 is other than 0, as a monitoring signal;

and, during initial setting;

said Euclid's algorithm apparatus inputs the coefficients of the syndrome equation S(z) and constant $\{s_{k-2}, s_{k-3}, \ldots, s_0, 0\}$ to said registers ak−1, . . . , a0, inputs the coefficients $\{s_{k-1}, s_{k-2}, \ldots, s_0\}$ of the syndrome equation S(z) to said registers bk−1, . . . , b0, inputs the constants $\{1, 0\}$ to said register lv, lv−1, inputs the constant 1 to said register mw, inputs a constant to said register dB, where 0<v<i, 0≦w <j, and v, w are integers, and, if the monitoring signal is 0, respectively shifts the data stored in said registers ak−1, . . . , a0 and said registers bk−1, . . . , b0 in the direction of increasing indices until the monitoring signal becomes 1, and increments or decrements the value stored in said register dB by the number of the shifts.

8. An Euclid's algorithm apparatus that has as its input the syndrome equation $$S(s)=s_{k-1}z^{k-1}+s_{k-2}z^{k-2}+\ldots+s_0,$$

where k>0, k is an integer, and $s_{kk-1}, \ldots, s_0$ are elements of a Galois field, has polynomial storage devices A, B, L, M and a Galois-field operations device, performs the initial setting of said polynomial storage devices A, B, L, M, depending on the syndrome equation, performs Galois-field operations by using said polynomial storage devices A, B, L, M and said Galois-field operations device, and obtains an error-locator-polynomial;

said Euclid's algorithm apparatus, during initial setting, storing the polynomial $$B(z)=s_{k-1}z^{k-1}+s_{k-2}z^{k-2}+\ldots+s_0$$

in said polynomial storage device B, storing the polynomial $$M(z)=1$$

in said polynomial storage device M, and, if the coefficients of the syndrome equation S(z) $s_{k-1}$−$s_{k/2}$≠0, storing the polynomial $$A(z)=s_{k-2}z^{k-1}+s_{k-3}z^{k-2}+\ldots+s_0z$$

in said polynomial storage device A and storing the polynomial $$L(z)=z$$

in said polynomial storage device L;

and if either one of the coefficients of the syndrome S(z) $s_{k-1}$−$s_{k/2}$ is 0, said Euclid's algorithm apparatus stores the polynomial $$A(z)=z^k$$

in said polynomial storage device A and stores the polynomial $$L(z)=1$$

in said polynomial storage device L.

9. The Euclid's algorithm apparatus defined in claim 8, wherein:

said polynomial storage device A has registers ak−1, . . . , a0;

said polynomial storage device B has registers bk−1, . . . , b0;

said polynomial storage device L has registers li−1, . . . , l0;

where i>0, and i is an integer;

said polynomial storage device M has registers mj−1, . . . , m0;

where j>0, and j is an integer;

said Euclid's algorithm apparatus has a syndrome monitoring device operable to monitor the coefficients of the syndrome equation S(z) to output 0 or 1 as a monitoring signal, depending on the coefficients of the syndrome equation S(z);

and, during initial setting;

said Euclid's algorithm apparatus inputs the coefficients $\{s_{k-1}, s_{k-2}, \ldots, s_0\}$ of the syndrome equation S(z) to said registers bk−1, . . . , b0, inputs the constant 1 to said register mw, where 0≦w<j, and w is an integer, and, if the monitoring signal is 1, inputs the coefficients of the syndrome equation S(z) and constant $\{s_{k-2}, s_{k-3}, \ldots, s_0, 0\}$ to said registers ak−1 , . . . , a0, and inputs the constants $\{1, 0\}$ to said register lv, lv−1, where 0<v<i, and v is an integer.

10. The Euclid's algorithm apparatus defined in claim 8, wherein:

said polynomial storage device A has registers ak, . . . , a0;

said polynomial storage device B has registers bk−1, . . . , b0;

said polynomial storage device L has registers li−1, . . . , l0;

where i>0, and i is an integer;

said polynomial storage device M has registers mj-l, . . . , m0, where j>0, and j is an integer;

said Euclid's algorithm apparatus has a syndrome monitoring device operable to monitor the coefficients of the syndrome equation S (z) to output 0 or 1 as a monitoring signal to let the monitoring signal be 0 if the coefficient $s_{k-1}$ of said syndrome equation S(z) is 0;

and, during initial setting;

said Euclid's algorithm apparatus inputs the coefficients $\{s_{k-1}, s_{k-2}, \ldots, s_0\}$ of said syndrome equation S (z) to said registers bk−1, . . . , b0, inputs the constant I to said register mw, where 0<w<j, and w is an integer, and, if the monitoring signal is 0, inputs the constants {1, . . . , 0, 0} to said registers ak, . . . , a0, and inputs the constant 0 to said register lv, where 0≦v<i, and v is an integer, and, if the monitoring signal is 1, inputs the coefficients of the syndrome equation S(z) and constant $\{s_{k-2}, s_{k-3}, \ldots, s_0, \mathbf{0}\}$ to said registers ap, . . . , ap-k+1, where p=k or p=k−1, and inputs the constants {0, 1} to said registers lq, lq-1, where 0<q<i, and q is an integer.

11. The Euclid's algorithm apparatus defined in claim 10, wherein:

said polynomial storage device A has a register dA;

said syndrome monitoring device lets the monitoring signal be 0, if at least one of the coefficients $s_{k-1}, \ldots, s_{k/2}$ of the syndrome equation S(z) is 0, lets the monitoring signal be 1, otherwise;

and, during initial setting;

said Euclid's algorithm apparatus inputs a constant e, where e is an integer, to said register dA if the monitoring signal is 0, and inputs a constant f, where f≠e, and f is an integer, to said register dA if the monitoring signal is 1.

* * * * *

UNITED STATES PATENT AND TRADEMARK OFFICE
CERTIFICATE OF CORRECTION

PATENT NO. : 6,374,384 B1
DATED : April 16, 2002
INVENTOR(S) : Kazuhiro Ohta et al.

It is certified that error appears in the above-identified patent and that said Letters Patent is hereby corrected as shown below:

<u>Column 23,</u>
Line 63, change "$L(z) = 1$" to -- $L(z) = 0$ --.

<u>Column 24,</u>
Lines 11 and 34, change "$L(z) = 1$" to -- $L(z) = 0$ --.

<u>Column 37,</u>
Lines 12, 29 and 41, change "$L(z) = 1$" to -- $L(z) = 0$ --.

<u>Column 38,</u>
Line 28, change "$L(z) = 1$" to -- $L(z) = 0$ --.

<u>Column 41,</u>
Lines 17 and 31, change "$L(z) = 1$" to -- $L(z) = 0$ --.

<u>Column 42,</u>
Line 35, replace "n" with -- An --.
Line 58, replace "polynomia" with -- polynomial --.

<u>Column 43,</u>
Line 7, change "$L(z) = 1$" to -- $L(z) = 0$ --.
Line 48, replace "$S(s) = s_{k-1}z^{k-1} + s_{k-2}z^{k-2} + \ldots + s_0$" with -- $S(z) = s_{k-1}z^{k-1} + s_{k-2}z^{k-2} + \ldots + s_0$ --.
Line 49, replace "$s_{kk-1}$" with -- $s_{k-1}$ --.

<u>Column 44,</u>
Line 22, change "$L(z) = 1$" to -- $L(z) = 0$ --.

UNITED STATES PATENT AND TRADEMARK OFFICE
CERTIFICATE OF CORRECTION

PATENT NO.     : 6,374,384 B1
DATED          : April 16, 2002
INVENTOR(S)    : Kazuhiro Ohta et al.

It is certified that error appears in the above-identified patent and that said Letters Patent is hereby corrected as shown below:

<u>Column 45,</u>
Line 4, replace "constant I" with -- constant 1 --.

Signed and Sealed this

Sixth Day of April, 2004

JON W. DUDAS
*Acting Director of the United States Patent and Trademark Office*